(12) United States Patent
Zeidler

(10) Patent No.: US 11,239,053 B2
(45) Date of Patent: Feb. 1, 2022

(54) CHARGED PARTICLE BEAM SYSTEM AND METHOD

(71) Applicant: Carl Zeiss MultiSEM GmbH, Oberkochen (DE)

(72) Inventor: Dirk Zeidler, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 17/002,472

(22) Filed: Aug. 25, 2020

(65) Prior Publication Data
US 2021/0005423 A1 Jan. 7, 2021

Related U.S. Application Data

(63) Continuation of application No. PCT/EP2019/054393, filed on Feb. 22, 2019.

(60) Provisional application No. 62/635,919, filed on Feb. 27, 2018.

(51) Int. Cl.
| | |
|---|---|
| *H01J 37/00* | (2006.01) |
| *H01J 37/317* | (2006.01) |
| *H01J 37/145* | (2006.01) |
| *H01J 37/147* | (2006.01) |
| *H01J 37/244* | (2006.01) |
| *H01J 37/26* | (2006.01) |
| *H01J 37/28* | (2006.01) |

(52) U.S. Cl.
CPC ........ *H01J 37/3177* (2013.01); *H01J 37/145* (2013.01); *H01J 37/1471* (2013.01); *H01J 37/244* (2013.01); *H01J 37/265* (2013.01); *H01J 37/28* (2013.01); *H01J 2237/0453* (2013.01); *H01J 2237/04924* (2013.01)

(58) Field of Classification Search
USPC ....................................................... 250/396 R
See application file for complete search history.

(56) References Cited

U.S. PATENT DOCUMENTS

| | | | |
|---|---|---|---|
| 4,130,761 | A | 12/1978 | Matsuda |
| 4,153,843 | A | 5/1979 | Pease |
| 4,200,794 | A | 4/1980 | Newberry |
| 4,338,548 | A | 7/1982 | Bono |
| 4,742,234 | A | 5/1988 | Feldman |
| 5,215,623 | A | 6/1993 | Takahashi |
| 5,864,142 | A | 1/1999 | Muraki |
| 5,892,224 | A | 4/1999 | Nakasuji |
| 5,905,267 | A | 5/1999 | Muraki |
| 5,981,954 | A | 11/1999 | Muraki |
| 6,107,636 | A | 8/2000 | Muraki |

(Continued)

FOREIGN PATENT DOCUMENTS

| | | |
|---|---|---|
| GB | 2519511 A | 4/2015 |
| GB | 2521819 A | 7/2015 |

(Continued)

OTHER PUBLICATIONS

International Search Report and Written Opinion for corresponding PCT Appl No. PCT/EP2019/054393, dated Feb. 27, 2020.

*Primary Examiner* — Phillip A Johnston
(74) *Attorney, Agent, or Firm* — Fish & Richardson P.C.

(57) ABSTRACT

Charged particle beam systems and methods, such as a multi beam charged particle beam system and related methods, can compensate sample charging.

27 Claims, 12 Drawing Sheets

(56) References Cited

U.S. PATENT DOCUMENTS

| | | | |
|---|---|---|---|
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,617,595 B1 | 9/2003 | Okunuki | |
| 6,633,366 B2 | 10/2003 | De Jager | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2 | 11/2004 | Tamamori | |
| 6,835,508 B2 | 12/2004 | Butschke | |
| 6,872,950 B2 | 3/2005 | Shimada | |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 | 9/2005 | Adamec | |
| 6,953,938 B2 | 10/2005 | Iwasaki | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 | 9/2006 | Ono | |
| 7,126,141 B2 | 10/2006 | Ono | |
| 7,129,502 B2 | 10/2006 | Kruit | |
| 7,235,799 B2 * | 6/2007 | Nakasuji | B82Y 10/00 250/310 |
| 7,244,949 B2 | 7/2007 | Knippelmeyer | |
| 7,285,779 B2 | 10/2007 | Litman | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 | 1/2013 | Han | |
| 8,384,051 B2 | 2/2013 | Ozawa | |
| 8,598,525 B2 | 12/2013 | Zeidler | |
| 8,618,496 B2 | 12/2013 | Wieland | |
| 8,704,192 B2 | 4/2014 | Sano | |
| 8,748,842 B2 | 6/2014 | Ohashi | |
| 8,779,399 B2 | 7/2014 | Yamanaka | |
| 8,822,919 B2 * | 9/2014 | Kimba | H01J 37/20 250/307 |
| 8,829,465 B2 | 9/2014 | Tsunoda | |
| 8,963,099 B2 | 2/2015 | Yamada | |
| 9,153,413 B2 | 10/2015 | Almogy | |
| 9,165,742 B1 | 10/2015 | Simmons et al. | |
| 9,263,233 B2 | 2/2016 | Zeidler | |
| 9,336,981 B2 | 5/2016 | Knippelmeyer | |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,607,805 B2 | 3/2017 | Liu | |
| 9,653,254 B2 | 5/2017 | Zeidler | |
| 9,691,586 B2 * | 6/2017 | Ren | H01J 37/12 |
| 9,702,983 B2 | 7/2017 | Eder | |
| 9,922,799 B2 | 3/2018 | Li | |
| 9,991,089 B2 | 6/2018 | Mueller | |
| 10,062,541 B2 | 8/2018 | Ren | |
| 10,121,635 B2 * | 11/2018 | Schubert | H01J 37/28 |
| 10,141,160 B2 | 11/2018 | Ren | |
| 10,354,831 B2 | 7/2019 | Kemen | |
| 10,388,487 B2 | 8/2019 | Zeidler | |
| 10,535,494 B2 | 1/2020 | Zeidler | |
| 10,541,112 B2 | 1/2020 | Schubert | |
| 10,586,677 B1 | 3/2020 | Okada | |
| 10,600,613 B2 | 3/2020 | Zeidler | |
| 10,622,184 B2 | 4/2020 | Knippelmeyer | |
| 10,643,820 B2 | 5/2020 | Ren | |
| 10,741,355 B1 | 8/2020 | Zeidler | |
| 10,784,077 B2 * | 9/2020 | Zhang | H01J 37/28 |
| 10,811,215 B2 | 10/2020 | Zeidler | |
| 10,854,423 B2 | 12/2020 | Sarov | |
| 10,879,031 B2 | 12/2020 | Ren | |
| 10,896,800 B2 | 1/2021 | Riedesel | |
| 2002/0166964 A1 | 11/2002 | Talbot et al. | |
| 2007/0194229 A1 | 8/2007 | Okuda et al. | |
| 2009/0014649 A1 | 1/2009 | Nakasuji | |
| 2010/0019648 A1 | 1/2010 | Yasuda et al. | |
| 2010/0133433 A1 | 6/2010 | Tanimoto et al. | |
| 2011/0272576 A1 | 11/2011 | Otaki et al. | |
| 2014/0197325 A1 | 7/2014 | Kato | |
| 2014/0224985 A1 | 8/2014 | Rodgers et al. | |
| 2017/0084424 A1 | 3/2017 | Masnaghetti et al. | |
| 2017/0133198 A1 | 5/2017 | Kruit | |
| 2017/0316912 A1 | 11/2017 | Zeidler et al. | |
| 2019/0333732 A1 | 10/2019 | Ren | |
| 2020/0211810 A1 | 7/2020 | Zeidler | |
| 2020/0243300 A1 | 7/2020 | Zeidler | |
| 2020/0373116 A1 | 11/2020 | Zeidler | |
| 2021/0005423 A1 | 1/2021 | Zeidler | |
| 2021/0035773 A1 | 2/2021 | Zeidler | |

FOREIGN PATENT DOCUMENTS

| | | |
|---|---|---|
| JP | 59184524 A | 10/1984 |
| JP | 60042825 A | 3/1985 |
| JP | 60105229 A | 6/1985 |
| JP | 61263217 A | 11/1986 |
| JP | 2002-245960 A | 8/2002 |
| JP | 2014229481 A | 12/2014 |
| WO | WO 2005/024881 A2 | 3/2005 |
| WO | WO2013032949 A1 | 3/2013 |
| WO | WO 2016/124648 | 8/2016 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

* cited by examiner

CHARGED PARTICLE BEAM SYSTEM AND METHOD

CROSS-REFERENCE TO RELATED APPLICATIONS

The present application is a continuation of, and claims benefit under 35 USC 120 to, international application PCT/EP2019/054393, filed Feb. 22, 2019, which claims benefit under 35 USC 119(e) to U.S. Provisional Application No. 62/635,919, filed Feb. 27, 2018. The entire disclosure of these applications are incorporated by reference herein.

FIELD

The present disclosure relates to charged particle beam systems and methods, including a multi beam charged particle beam system and related methods.

BACKGROUND

A multi beam charged particle beam system is disclosed, for example, in WO2005024881A2 and in WO2016/124648.

For multi beam charged particle beam systems, such as multi beam electron microscopes, interaction products, i.e. secondary electrons, originating from different primary charged particle beams can be imaged onto separate detectors by a projective system. To this end, electrostatic extraction fields can be used. A homogeneous extraction field can help ensure the imaging of the interaction products, such as secondary electrons, onto individual detectors and that a mapping between scan deflector voltages and respective beam positions at the individual detectors of the multi detector is faithful. The spot shape of the secondary electrons at a multi detector, for example a scintillator forming a component of the multi detector, typically depends on the homogeneity of the electrostatic extraction field. As one spot is imaged onto one corresponding detector, the homogeneity of the electrostatic extraction field can govern the cross talk between beams and the corresponding detection signals.

In the presence of residual charges on the sample surface, the electrostatic extraction field can become distorted locally. Thereby, the imaging to separate detectors can become perturbed to an extent that a viable scan of the surface is not possible. Especially, the positioning of the beams at the detector can become strongly time-dependent and primary beam position dependent. Many common methods for charge mitigation in scanning electron microscopes (SEM) are not straightforward to adapt to both the primary and secondary beam path of a multi beam scanning beam system, especially with respect to the extraction field homogeneity constraints for good secondary imaging. Available methods to realign the detectors in steady-state cases (i.e. between workflow runs or between recording of image frames) are often not fast enough to steer the beams in a multi beam charged particle beam system.

One widely used strategy to faithfully image charging samples with charged particle beams is to pre-charge the sample with a second charged particle generator, a so-called flood gun, such that the surface potential after flooding is set to a value that the concurrent imaging is performed at the yield-neutral point. Generally, the flood gun is either directed to the sample from the side, switching between imaging and flooding mode without moving the sample, or the flood gun is mounted on the chamber lid next to the imaging system, and flooding is performed by moving the sample between these two positions. For high-throughput charged particle beam imaging systems, none of these strategies is typically very desirable, as moving the sample back and forth between flooding and imaging position will reduce throughput. The large-FOV pole piece geometry of multi beam charged particle imaging systems can make pointing a flood gun at the location to be imaged challenging, as the distance between the lowest pols piece and the sample can be approximately few mm or less, with a small cleft between the lowest pole piece and the sample over a large area. Even if one were to guide the flooding beam inside this cleft towards the imaging position, the electrostatic field present in this area can add further challenges to pointing the flooding beam faithfully.

SUMMARY

The present disclosure seeks to provide improved multi beam charged particle beam systems and methods, including for use where the sample charges due to the impinging primary charged particle beams or beamlets.

The present disclosure relates to a charged particle beam system including at least a first charged particle source configured to generate a first charged particle beam, a multi beam generator configured to generate a plurality of charged particle beamlets from the incoming first charged particle beam, an objective lens, a projective system, a sample stage, a detector system including a plurality of individual detectors, and a control configured to control the operation of the multi beam generator, the objective lens and the projection system. The control provides a first mode of operation and a second mode of operation. In the first mode of operation the control controls the multi beam generator to be configured that each individual beamlet of the plurality of charged particle beamlets is spatially separated from other beamlets of the plurality of charged particle beamlets, and in the first mode of operation the control further controls the objective lens to be configured to focus incoming charged particle beamlets in a first plane in a manner that a first region in which a first individual beamlet of the plurality of charged particle beamlets impinges in the first plane is spatially separated from a second region in which a second individual beamlet of the plurality of charged particle beamlets impinges in the first plane, and in the first mode of operation the control controls the projective system to be configured to image interaction products leaving the first region within the first plane due to impinging charged particles onto a first one of the plurality of individual detectors and to image interaction products leaving the second region in the first plane due to impinging charged particles onto a second one of the plurality of individual detectors. In the second mode of operation the control controls the operation of the multi beam generator in combination with the objective lens to be configured that a single or plural defocused charged particle beam(s) is/are provided in the first plane.

Controlling the operation of the multi beam generator in combination in this disclosure means that the control either only changes the adjustment of the multi beam generator when switching between the first mode of operation and the second mode of operation, if changing only the adjustment of the multi beam generator is sufficient to achieve a sufficiently broad defocused charged particle beam in the first plane, or alternatively, the control changes the adjustment of the multi beam generator as well as the adjustment of the objective lens when switching between the first mode of operation and the second mode of operation, if this is used to achieve a sufficiently broad defocused charged particle beam in the first plane.

In some embodiments, the charged particle beam system further includes a voltage supply configured to supply a variable voltage to the sample stage, wherein in the first mode of operation the control controls a voltage supply of the objective lens and/or the voltage supply of the sample stage in a manner that the charged particles of the charged particle beamlets have a first average kinetic energy in the first plane, and wherein the control controls the voltage supply of the objective lens and/or the voltage supply of the sample stage in the second mode of operation in a manner that the charged particles have a second average kinetic energy in the first plane that is different from the first average kinetic energy. The first average kinetic energy can be greater than 400 eV (e.g., greater than 1000 eV, greater than 1500 eV, larger than 2000 eV), depending on the type of sample imaged and desired sample contrast. The second average kinetic energy is less than 1000 eV (e.g., less than 500 eV, less than 200 eV, less than 50 eV), depending on the sample composition and charging properties as a function of kinetic energy of the incoming charged particles. Especially the first average kinetic energy can be adjusted to any value in the range between 400 eV and 3000 eV. Optionally, the first average kinetic energy can be adjusted to any value in the range between 200 eV and 5000 eV. The second average kinetic energy can be adjusted to any value in the range between 200 eV and 1000 eV. Optionally, the second average kinetic energy can be adjusted to any value in the range between 50 eV and 2000 eV.

In some embodiments, in the second mode of operation the defocused charged particle beam has a second diameter in the first plane, wherein in the first mode of operation a minimum diameter of a circle surrounding an area onto which the plurality of charged particle beamlets impinge in the first plane has a first diameter, and wherein the second diameter is at least 1.2 times (e.g., at least 2 times, at least 5 times, at least 10 times, at least 50 times) the first diameter.

In some embodiments, in the second mode of operation the defocused charged particle beam illuminates a surface in the first plane having a second surface area, wherein in the first mode of operation a minimum surface area within which all beamlets of the plurality of charged particle beamlets impinge in the first plane has a first area, and wherein the second surface area is at least 1.5 times (e.g., at least 4 times, at least 10 times, at least 100 times, at least 200 times) the first surface area.

In some embodiments, the multi beam generator includes at least a first aperture plate, wherein the first multi aperture plate includes a plurality of holes for forming the plurality of charged particle beamlets. The holes in first multi aperture plate can have a first hole diameter, and the first multi aperture plate can have has at least one second hole having a second hole diameter, wherein the second hole diameter is at least 5 times the first hole diameter.

In some embodiments, the first multi aperture plate can have, besides the first holes for forming the plurality of charged particle beamlets, more than one (e.g., two, three, or more) second holes having a second hole diameter, wherein the second hole diameter is at least 5 times the first hole diameter.

In some embodiments, the first multi aperture plate is displaceable in a direction perpendicular to the direction of beam propagation of the charged particle beam.

Switching between the first mode of operation in which the sample is scanned simultaneously by a plurality of charged particle beamlets, and flooding of the sample by an electron beam then is achieved by displacing the first multi aperture plate relative to the first charged particle beam so that the first charged particle beam impinges on one or more of the second holes.

In some embodiments, the charged particle beam system further includes a first single or double deflection system arranged between the charged particle source and the first multi aperture plate, and a second single or double deflection system arranged between the first multi aperture plate and the objective lens. In this embodiment, switching between the first mode of operation in which the sample is scanned simultaneously by a plurality of charged particle beamlets, and flooding of the sample by a defocused electron beam then is achieved by displacing the first charged particle beam by appropriate excitation of the single or double deflection system relative to the first multi aperture plate so that the first charged particle beam impinges on one or more of the second holes. Accordingly, in the second mode of operation, the control controls the first single or double deflection system and the second single or double deflection systems to pass the charged particle beam through the at least one second hole. The second single or double deflection system serves to realign the charged particle beams having passed the second holes to the axis of the charged particle beam system.

In some embodiments, the charged particle beam system further includes a beam splitter arrangement upstream of the objective lens to separate a primary beam path of the primary charged particle beamlets from the charged particle source to the first plane from a secondary beam path of interaction products, caused by the primary charged particle beamlets to leave a sample, from the sample to the detector system.

In some embodiments, the charged particle beam system further includes a second charged particle source providing a second charged particle beam, a deflection system and a beam stop, wherein the control is configured to control the deflection system to direct the second charged particle beam onto the beam stop in the first mode of operation and to direct the second charged particle beam to pass the beam stop in the second mode of operation.

The objective lens can include an opening, for example an opening within the pole piece of a magnetic lens or several aperture openings of electrodes if the objective lens in an electrostatic lens, through which the primary charged particle beamlets pass in the first mode of operation. In some embodiments, the second charged particle beam also passes through this opening in the objective lens in the second mode of operation before impinging defocused onto the sample.

The charged particle beam system can further include a flooding beam stop and a deflection system arranged upstream of the objective lens, and the control can be configured to control the deflection system to direct the primary charged particle beamlets to pass the flooding beam stop in the first mode of operation and to direct the charged particle beamlets to the flooding beam stop in the second mode or operation.

In some embodiments, the projective system includes a first subcomponent providing low-frequency adjustments and a second subcomponent providing high frequency adjustments. The subcomponent providing high frequency adjustments can include at least one of the group consisting of electrostatic lenses, electrostatic deflectors and electrostatic stigmators.

In some embodiments, the projective system includes a current monitoring aperture in a cross-over plane.

In some embodiments, the charged particle beam system can furthermore include a fast CCD camera.

In some embodiments, the charged particle beam system also includes a computer system configured to analyze an actual state of the projective system and to manipulate the second subcomponent during scanning of a sample by the plurality of charged particle beamlets. The computer system can be configured to adjust the second subcomponent in a manner that positions of the interaction products on the individual detectors are kept constant also in the case of a sample charging. To achieve this, the computer can be configured to adjust the projective system in a two-step mode, whereby, in a first step the first component is adjusted while the second subcomponent is kept constant or switched-off, and, in a second step the second subcomponent is adjusted while the first subcomponent is kept constant.

In some embodiments, the charged particle beam system can further include a projective beam stop between the first plane and the detector system and a deflection system between the first plane and detector system. The control can be configured to control the deflection system to direct interaction products from the charged particle beamlets to impinge onto the detector system in the first mode of operation and to direct the interaction products of the second defocused charged particle beams to the beam stop in the second mode or operation.

The present disclosure also relates to a method of operating a charged particle beam system, which includes: in a first mode of operation, forming a plurality of charged particles beamlets of a multi beam charged particle beam system, scanning a sample with the charged particle beamlets and detecting interaction products leaving the sample due to the impinging plurality of charged particles beamlets, and, in a second mode of operation, flooding the sample with a defocused charged particle beam, switching between the first mode of operation and the second mode of operation several times while recoding an image of the sample, and changing at least one of the parameters of landing energy, focus, stage position and beam deflection of the charged particle beam system when switching between the first mode of operation and the second mode of operation.

In some embodiments, in the second mode of operation the defocused charged particle beam has a second diameter in the first plane, wherein in the first mode of operation a minimum diameter of a circle surrounding an area onto which the plurality of charged particle beamlets impinge in the first plane has a first diameter, and wherein the second diameter is at least 1.2 times (e.g., at least 2 times, at least 5 times, at least 10 times, at least 50 times) the first diameter. A large second diameter ensures a homogenous charge compensation on the sample.

In some embodiments, in the second mode of operation the defocused charged particle beam illuminates a surface in the in the first plane having a second surface area, wherein in the first mode of operation a minimum surface area within which all beamlets of the plurality of charged particle beamlets impinge in the first plane has a first area, and wherein the second surface area is at least 1.5 times (e.g., at least 4 times, at least 10 times, at least 100 times, at least 200 times) the first surface area.

In some embodiments, the method further includes, in the first mode of operation, directing interaction products form the charged particle beamlets to impinge onto a detector system, and in the second mode of operation, directing interaction products from a sample to a projective beam stop.

In some embodiments, the method further includes: aligning the multi beam charged particle beam system with static methods and static charged particle optical elements, with a fast multi beam projective alignment method in an off state, and, activating a fast multi beam projective alignment system before a first image is recorded by controlling a state of a charged particle projective system for optimal imaging of interaction products onto a plurality of detectors and controlling the fast multi beam projective alignment system.

In some embodiments, the subcomponent providing high frequency adjustments includes at least one of the group including electrostatic lenses, electrostatic deflectors and electrostatic stigmators. Ideally the subcomponent providing high frequency adjustments only consists of electrostatic elements, such as electrostatic lenses, electrostatic deflectors and electrostatic stigmators, but does not include any magnetic elements.

In some embodiments, the subcomponent of the projective system providing high frequency adjustments can include a multi lens including at least one multi-aperture plate. Each aperture of this multi aperture plate can be surrounded by at least two, four or even more electrodes which are electrically insulated relative to each other as well as relative to the carrier of the multi aperture plate. By applying different electrical potentials to the electrodes each secondary charged particle beamlet of the interaction products can be adjusted individually to correct individual distortions of each secondary charged particle beamlet individually.

In some embodiments that include a fast CCD camera, the fast CCD camera can be used to identify changes of the locations of the images of the interaction products in a detection plane due to a charging of the sample.

In some embodiment, the computer system is configured to adjust the second (dynamic or high frequency) subcomponent of the projective system in a manner that positions of the interaction products on the individual detectors of the multi detector are kept constant.

In some embodiments, the computer is configured to adjust the projective system in a two-step mode, whereby, in a first step the first (low frequency) subcomponent is adjusted while the second (dynamic) subcomponent is kept constant or switched-off, and in a second step the second (dynamic) subcomponent is adjusted while the first subcomponent is kept constant.

In some embodiments, a method can further include: aligning a multi beam charged particle beam system with static methods and static charged particle optical elements, with a fast multi beam projective alignment method in an off state, rigging and starting a workflow and, activating a fast multi beam projective alignment system before a first image is recorded by controlling a state of a charged particle projective system for an optimal imaging of interaction products onto a plurality of detectors, and controlling the fast multi beam projective alignment system.

The alignment of the projective system with the aid of the dynamic subcomponent can be carried out and repeated several times while the workflow of recording images of the sample is carried-out.

The fast projective system alignment to compensate for sample charging effects on detector collection efficiency and crosstalk can provide a synchronization of the scan system of the multi beam charged particle beam system and a fast detector camera and real-time projective system alignment algorithms as well as a low latency control of the projective system alignment elements.

The projective system can include a combination of a magnetic lens or several magnetic lenses with electrostatic elements. With the electrostatic elements hysteresis are eliminated and switching times of a few ms instead of seconds are achieved. In addition, a Larmor rotation during adjustment can be avoided by only changing electrostatic elements.

Electrostatic deflectors and/or electrostatic stigmators in the projective path of the interaction products can result in no eddy currents, no inductivity and adjustment times of µs instead of ms.

With a zoom aperture such as described in FIG. 2 of WO2016/124648 a fast virtual change of an aperture size can be achieved. Additional fast deflectors in the secondary charged particle beam path of the interaction products provide the possibility of a fast alignment of the beam paths onto the detector system.

With the aid of a fast angle-resolved current monitor arranged in a crossover plane of the beam paths of the interaction products a centering of the crossover in real-time can be achieved.

The fast CCD camera and electrostatic alignment elements can be directly coupled by the computer system. Thereby latencies through the main control software that controls all other elements can be avoided and in an off-mode of the electrostatic alignment elements the secondary electron projection is not effected by them at all. The computer system can include a graphic processing unit (GPU) and can be FPGA assisted. The alignment algorithms can be configured for achieving a fast spot position detection in the images recorded by the CCD camera. An optimal shift of the secondary electron beamlets can be achieved by using sensitivities of deflection elements of the excitation of deflectors, and can use a feedback loop for a direct optimization. In the case of image distortion an excitation of stigmators can be used for adjusting optimal shapes and/or positions of the secondary electrons by using sensitivities of stigmators on the shape and positions of the secondary electron beam spots and by using a feedback loop for direct optimization of the shape and/or position of the secondary electron beam spots.

With the alignment algorithms, the excitation of stigmators can be adjusted for an optimal spot shape and/or spot positions by using sensitivities of stigmators and by using feedback loops for direct optimization. The excitation of focusing elements and sample high voltage bias can be adjusted for optimal spot shape and/or spot positions by using sensitivities of lenses, and also using feedback loops for direct optimization. For a crosstalk detection, a virtual aperture size can be changed via a projective cross-over zoom system and the respective control algorithms for optimization of throughput (TPT) vs. crosstalk in real time (once per frame).

The alignment algorithms can provide a fast switching from an image recording mode to a crossover monitoring mode, e.g. during flyback of the scanned electron beams, i.e. while, after a line or field on the sample has been scanned by the electron beamlets, the electron beamlets are moved back to the starting point of a new line or new frame; during such flyback normally no interaction products of the electron beamlets with the sample are recorded. An optimization of the crossover position can be achieved by a crossover monitoring in situ.

Some embodiments can include an aperture covered with a scintillating material and to detect with a fast camera the scintillation due to electrons impinging on the scintillating material. Also this such embodiments can provide a cross-over monitor for a real-time centering.

A fast angle-resolved current detection on an aperture can be advantageous for centering and/or alignment of the crossover by adjusting the electrostatic elements to achieve a minimized current or light emission detected by an angle-resolved current detector or the fast camera.

BRIEF DESCRIPTION OF THE DRAWINGS

More details are disclosed with reference to the attached drawings. Thereby shows.

DESCRIPTION OF EXEMPLARY EMBODIMENTS

Figure 1:
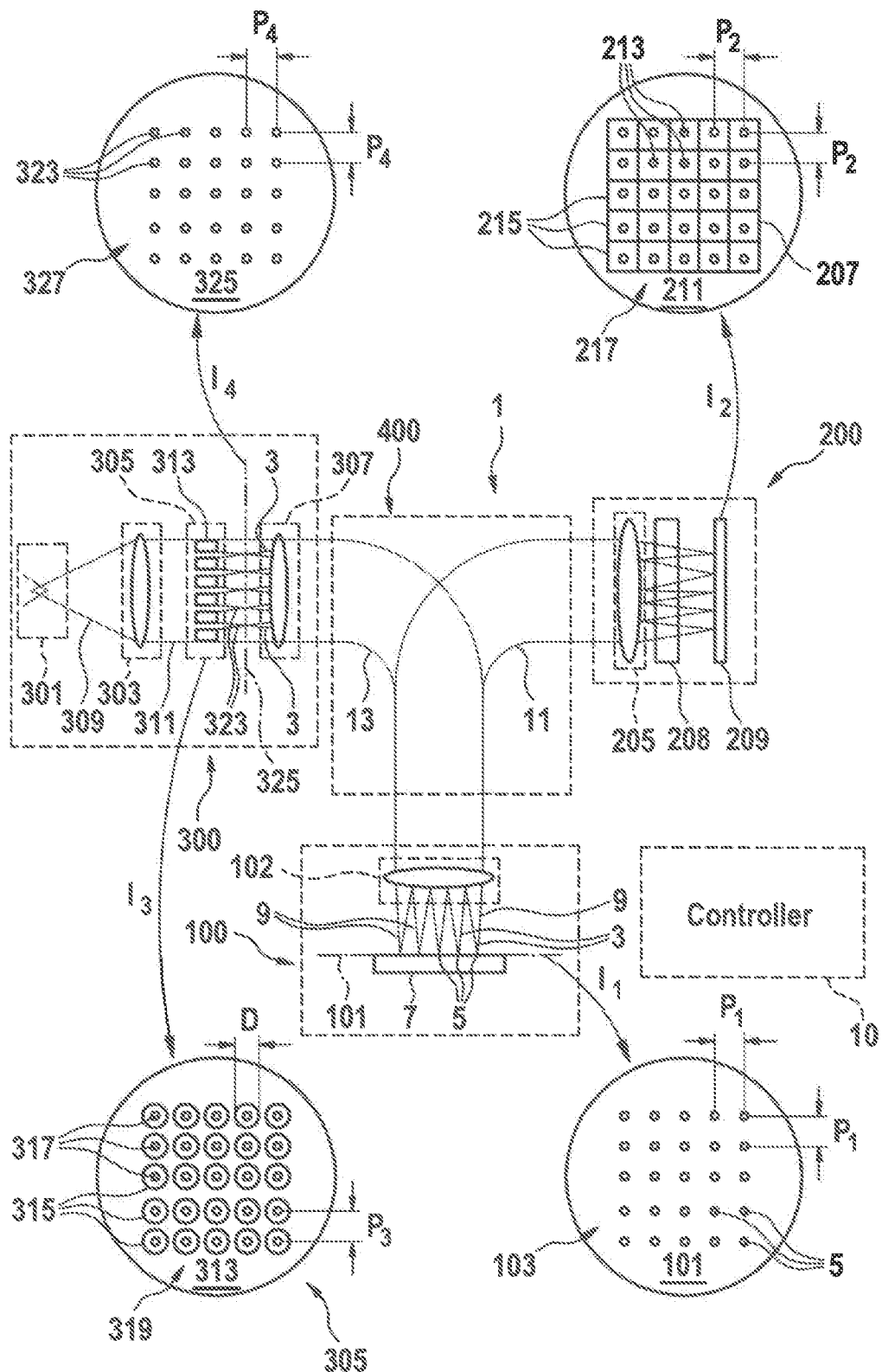
FIG. 1: A sketch of an embodiment of a multi beam charged particle system.

In the exemplary embodiments described below, components similar in function and structure are indicated as far as possible by similar reference numerals.

The schematic representation of FIG. 1 illustrates basic features and functions of a multi-beamlet charged-particle beam system 1. It is to be noted that the symbols used in the Figure do not represent physical configurations of the illustrated components but have been chosen to symbolize their respective functionality. The type of system shown is that of a scanning electron microscope (SEM) using a plurality of primary electron beamlets 3 for generating primary electron beam spots 5 on a surface of an object 7 located in an object plane 101 of an objective lens 102. It goes however without saying that the features and functions of system 1 can also be implemented using instead of electrons other types of primary charged particles such as ions and in particular helium ions, positrons, muons, and others.

The microscopy system 1 shown includes a charged-particle multi-beamlet generator 300 for generating a plurality of primary charged-particle beamlets 3, a beam splitter unit 400 for separating the secondary charged-particle beam path 11 from the primary charged-particle beam path 13, an object irradiation unit 100 adapted to focus the primary charged-particle beamlets 3 onto the object plane 101, and a detection unit 200 for creating individual intensity signals for each of the secondary charged-particle beamlets 9.

In the embodiment illustrated, the primary beamlet generator 300 includes an electron source 301, a collimating lens 303, a primary beamlet-forming unit 305, and a field lens 307.

The electron source 301 generates a diverging electron beam 309 that is collimated by the collimating lens to form a beam 311 incident on the primary beamlet-forming unit 305. Instead of an electron source generating just one diverging electron beam 309 as shown in FIG. 1, an electron source creating two or more diverging electron beams may be used. The two or more electron beams are then collimated either by just one collimating lens 303 or by an appropriate number of collimating lenses 303, each collimating a subset or just one of the individual electron beams 309.

The beamlet-forming unit 305 basically includes a first multi-aperture plate illuminated by the one or more electron beams 311 and a second multi-aperture plate located, with respect to the direction of movement of the electrons in beam 311, downstream of the first multi-aperture plate. The second multi-aperture plate is preferably set to a defined potential so that a focusing quality is conferred to the apertures and the second multi-aperture plate takes on the function of a micro lens array.

The primary electrons incident on object 7 at a beam spot 5 generate secondary electrons emanating from the surface of the object 7. The secondary electrons form secondary electron beamlets 9, which traverse the objective lens 102 and the beam splitter unit 400 and follow the secondary beam path 11. The beam splitter unit 400 separates the secondary beam path 11 from the primary beam path 13 usually via magnetic fields and directs the secondary beam path 11 to a detection unit 200.

The detection unit 200 includes a projecting lens 205 for projecting the secondary electron beamlets 9 onto a surface plane 211 of an electron sensitive detector 207 of a detector arrangement 209. The electron sensitive detector 207 can be a single device or include more than one individual detectors. Irrespective of this, detector 207 provides an array of sensing areas arranged in a pattern compatible to the pattern of the secondary charged-particle beamlets 9 focused by the projecting lens 205 onto the detector surface 211. This enables a detection of each individual secondary charged-particle beamlet 9 independent of the other secondary charged-particle beamlets 9 incident on the detector surface 211. Thus a plurality of electrical signals is created, whereby the value of each signal corresponds to the characteristics of just one of the secondary beamlets 9.

If the primary beamlet generator 300 allows not only to change the patterns of the primary beamlets 3 such that each pattern forms a sub-pattern of a basic pattern, but also to change the basic pattern, the detector arrangement 209 is preferably equipped with further detectors 207, each having its sensing areas arranged in a different basic pattern. Since the patterns of the secondary beamlets 9 correspond to the patterns of the primary beamlets 3 generated by the primary beamlet generator 300, the sensing area array pattern of each detector 207 preferably corresponds to one of the patterns available for the primary beamlets 3.

The object irradiation unit 100 includes an objective lens 102 focusing the primary charged-particle beamlets 3 onto the object plane 101 in which the investigated surface of an object 7 is positioned by an object mount like for example a sample stage. The object mount is not shown in the Figures. The object irradiation system 100 further includes a deflection system (not shown) by which the plurality of charged-particle beamlets can be deflected in a direction perpendicular to the direction of beam propagation in order to scan the surface of the sample concurrently with the plurality of focused charged particle beamlets.

In the illustrated example, the primary charged particle source is implemented in form of an electron source 301 featuring an emitter tip 310 and an extraction electrode 302. When using primary charged particles other than electrons, like for example helium ions, the configuration of the primary charged-particle source 301 may be different to that shown.

The electron source 301 emits a divergent electron beam 309, which is collimated in the shown example by collimating lens 303 to form a collimated beam 311. The collimating lens 303 is usually formed by one or more electrostatic or magnetic lenses, or by a combination of electrostatic and magnetic lenses. The use of a collimating lens is not imperative, but it is preferred when the multi-aperture plates used in the beamlet-forming unit 305 have a planar configuration, i.e. a configuration where the apertures 315 are arranged in a non-curved plane. When no collimating lens 303 is used, the apertures 315 of the multi-aperture plates 313 and 320 are preferably arranged in a curved plane which curvatures are adapted to the divergence of the primary beam 309 as e.g. described in document WO 2007/028596 A1, which is hereby incorporated by reference.

The collimated beam 311 (or the non-collimated beam, if no collimating lens is used) is incident on the multi-aperture selector plate 313 of the primary beamlet-forming unit 305. The multi-aperture plate selector 313 has two or more aperture arrays 317 formed therein. Each aperture array includes one or more apertures 315 formed in the multi aperture selector plate 313. The apertures of a multi-aperture array may be arranged in a one-dimensional or in a two-dimensional pattern, whereby two-dimensional patterns are preferred for a fast inspection of an object's surface.

The detection system further includes a filter 208 with the aid of which interaction products leaving the sample 7 in the first plane 101 (for example secondary electrons) can be filtered according to their trajectories or beam paths. An example of a respective detection system with a filter is shown in FIG. 2.

The multi beam system further includes a computer system or controller 10 which is configured to control the individual charged particle beam components as well as for evaluating and analyzing images recorded with multi detector 209. In addition the controller 10 is configured to generate images based on the detection signals gathered with multi detector 209 on a display.

Figure 2:
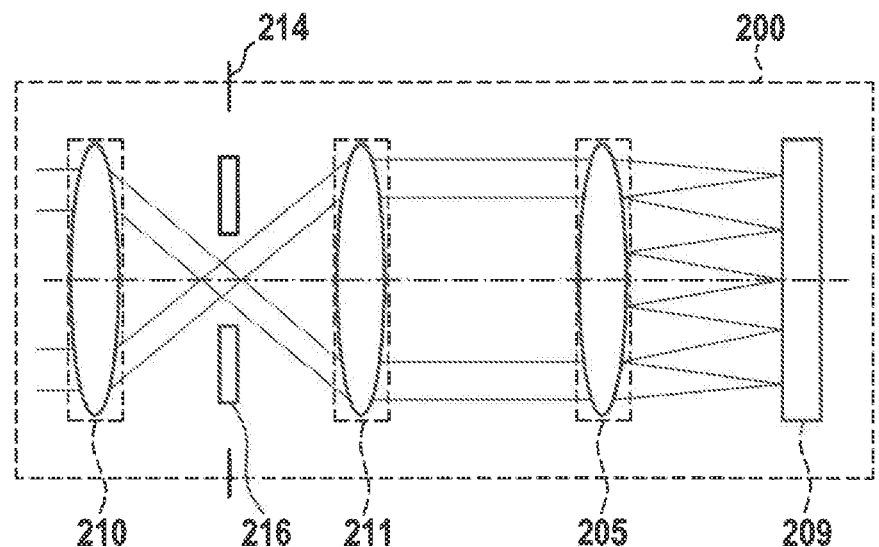
FIG. 2: A sketch of a detection system of a first embodiment.

The detection system 200 in FIG. 2 includes in addition to the projection lens 205 and the multi detector 209 two additional charged particle lenses 210, 211. The first additional charged particle lens 210 forms a crossover in a crossover plane 214. In this crossover plane the beam paths of the interaction products which leave the first plane 101 in different regions, i.e. the beam paths of the secondary electron beamlets, are superimposed. The second additional charged particle lens 211 is operated so that its focal plane substantially coincides with the crossover plane 214 of the first additional charged particle lens 210. The beam paths of the interaction products leaving the first plane 101 then run separated from each other downstream of the second additional charged particle lens 211 and are projected by projection lens 205 onto separate detection regions 215 of the multi detector 209.

Figure 6:
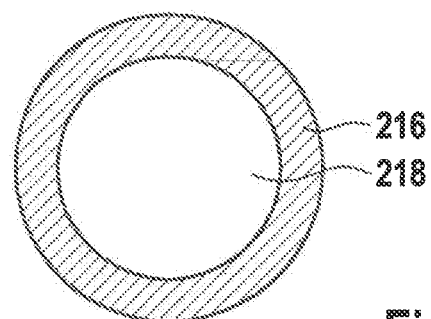
FIG. 6: A diaphragm which can be provided in the projective system to achieve a filtering of the secondary electron beamlets.

In the crossover plane 214 or in the neighborhood thereof a diaphragm 216 is arranged with the aid of which the interaction products can be filtered according to their beam paths. A first embodiment for a diaphragm is shown in FIG. 6 which includes a circular opening 218. The circular opening 218 is transmissive for interaction products while an outer portion of the diaphragm 216 is non-transmissive for the interaction products. With such kind of bright-field diaphragm in the crossover plane of the projective system a crosstalk between different individual detection fields, i.e. a crosstalk between the beam paths of interaction products leaving the first plane 101 in a first region and a detector assigned to interaction products leaving the first plane 101 in a second region different from the first region, can be avoided or at least reduced.

Regarding further details of the system shown in FIG. 2 and the diaphragm shown in FIG. 6, reference is made to the description of the respective Figures in WO2016/124648 the disclosure of which with respect to the respective FIGS. 2 and 6 thereof is hereby incorporated by reference.

Figure 7:
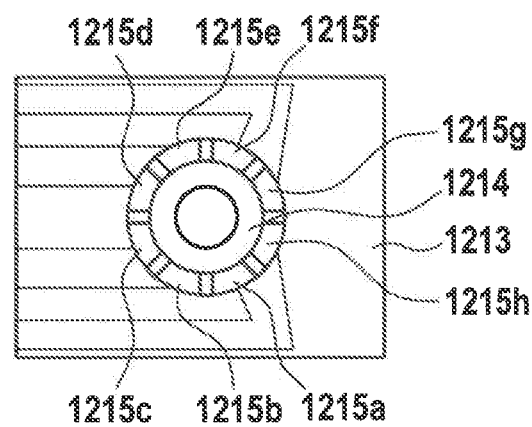
FIG. 7: A an embodiment of a aperture diaphragm with cross-over monitoring capabilities for an angle dependent current readout for crossover position correction.

An alternative embodiment for a diaphragm in a detection system 200 is shown in FIG. 7. The diaphragm 1213 also has a circular opening 1214 which is transmissive for interaction products. However the circular opening is surrounded in a radial direction by a couple of electrodes 1215a to 1215h which are electrically insulated with respect to each other as well as with respect to the body of the diaphragm. The electrodes can serve as current detectors. Each electrode includes a signal line via which an electrical current induced within each electrode can be detected. By detecting asymmetries in the currents or charges induces in the set of electrodes 1215a to 1215h a decentering of the charged particle beamlets passing the aperture of the diaphragm can be detected.

In an alternative embodiment, instead of electrodes being arranged around the circular opening 1214 a scintillating material can be provided on the surroundings of the circular opening, and furthermore light detectors are provided to detect light emitted by the scintillating material due to impinging electrons. By detecting asymmetries in the light emission of the scintillating material a decentering of the charged particle beamlets passing the diaphragm 1213 can be detected.

Figure 8:
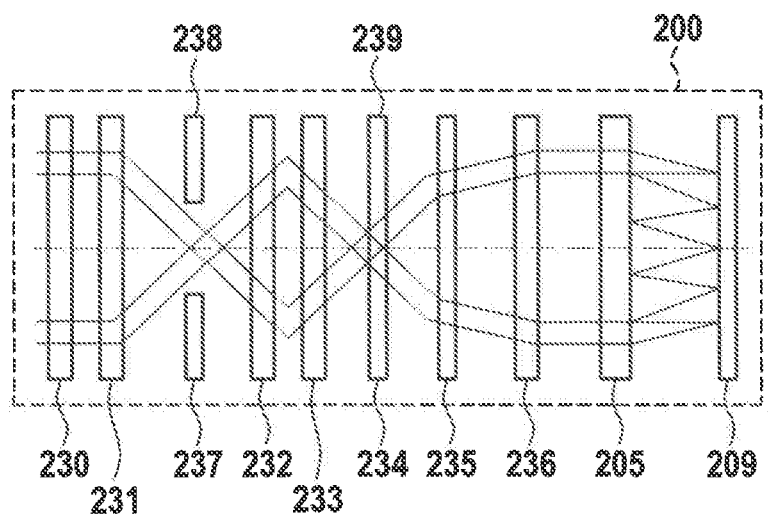
FIG. 8: A further embodiment of a detector system.

The diaphragm shown in FIG. 7 as well as the above described alternative embodiment for a diaphragm can be used as a in-situ crossover monitor if arranged in the crossover plane 214 of the detection system shown in FIG. 2 or the crossover plane 238 of FIG. 8. Accordingly, the projective system includes a current monitoring aperture in a crossover plane.

FIG. 8 shows an alternative of a detection system providing the possibility of filtering interaction products according to their beam paths. FIG. 8 is identical to FIG. 4 in WO2016/124648 and regarding a description of this detection system and its capabilities and advantages it is referred to the respective description of FIG. 4 in WO2016/124648, which is hereby incorporated by reference. It should especially be noted that the system shown in FIG. 8 (or FIG. 4 in WO2016/124648) forms a crossover-zoom system as this also is described in more detail in WO 2016/124648.

Figure 3:
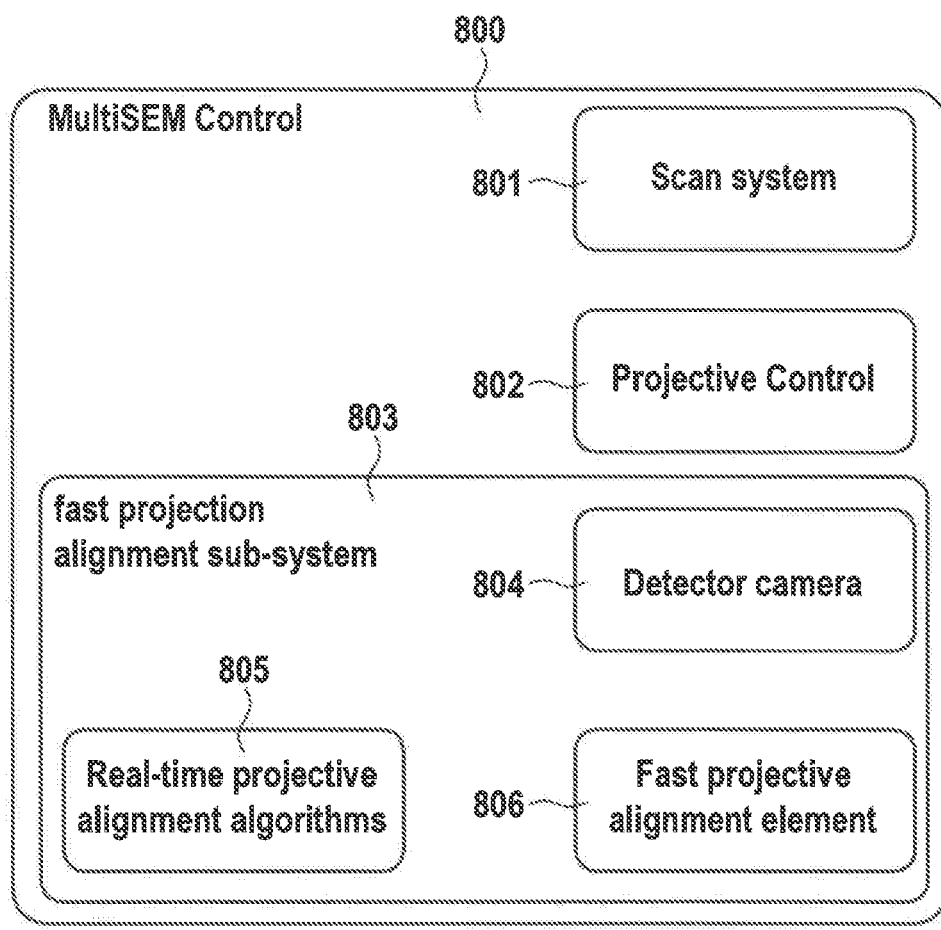
FIG. 3: A block diagram of a portion of a multi beam projective control with a fast (dynamic) subcomponent for the projective system control in the beampaths of secondary electron beamlets.

FIG. 3 is a block diagram of a portion of the control system 800 (which corresponds to the control system 10 in FIG. 1) of the multi beam charged particle beam system. The control system 800 includes a scan system control component 801 and a control 802 for the static or low frequency subcomponents of the projective system for adjusting the charged particle beam lenses and multipoles. The control system 800 further includes a fast projective alignment sub-system including a detector camera 804 (corresponding to the spatially resolved detection system 290 in FIG. 4), real-time projective alignment algorithms 805 and one or more fast projective alignment element(s). The control system shown in FIG. 3 especially can be used for controlling, inter alia, a projective system as shown in FIG. 4 and described in more detail hereinafter.

Figure 4:
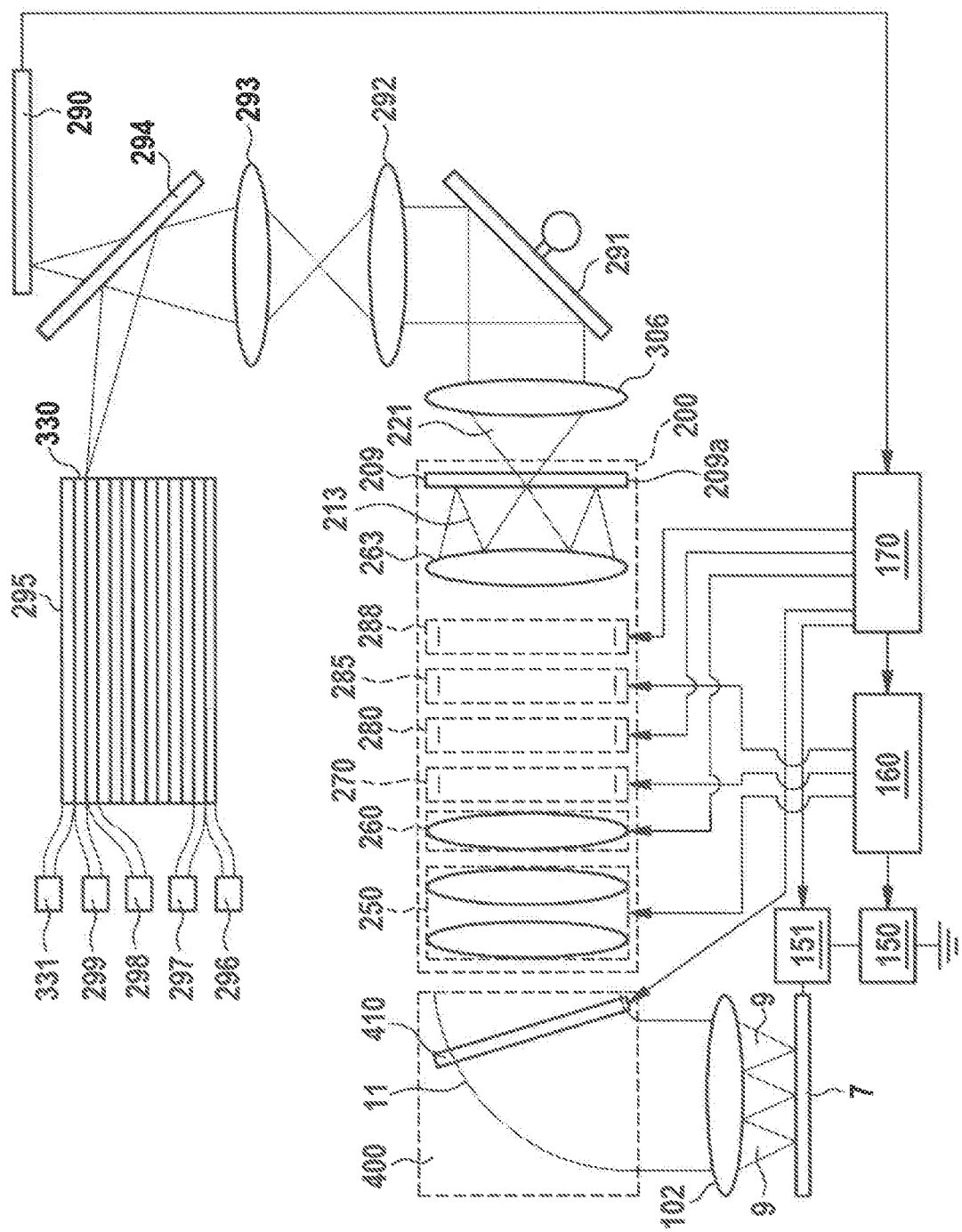
FIG. 4: A sketch of a projection path with additional electrostatic deflectors, electrostatic stigmators, electrostatic lenses, a beam splitter, a deflector and a starting energy HV supply.

The projective system 200 in FIG. 4 includes a set of static (or low frequency) electron optical elements 250, 270, and 285, and a set of dynamic (or high frequency) electron optical elements 260, 280, and 288. The static electron optical elements are used for imaging of secondary electrons (SE) 3 from sample 7 onto the detection plane 209a. These can include one or more electron optical lenses 251, deflectors 271, and/or stigmators 286. As slow alignment times are sufficient in the static case, magnetic lenses, magnetic deflectors, and magnetic stigmators are used. A controller 160 controls the static electron optical elements 250, 270, and 285, as well as the static sample potential via a static voltage supply 150. To this end, the controller uses a spatially resolving detection system 290 that uses a fraction of the signal impinging onto the detection plane 209a. For example, a spatially resolved detection system 290 can include a fast CCD camera that images a fraction of the light emanating from spots from the detection plane 209a, where a plate made of a scintillating material placed onto a transparent carrier can be arranged to form a multi detector 209. Most of the signal produced in the detection plane 209a is used for feeding into the image acquisition system. The image acquisition system also forms part of the multi detector.

As described above, in the detection plane 209a a scintillator plate 209 is arranged onto which the secondary electron beamlets are directed by the projective system 200. The projective system 200 includes, when integrated in the multi-beam inspection system of FIG. 1, electron-optical components forming the electron beamlets 9, i.e., for example the objective lens 102 guiding the electron beamlets towards the multi electron-detector, the beam splitter 400 and components focusing the electron beamlets 9 onto the surface of the scintillator plate 209 such as the lens 263. The electron beamlets 9 are incident onto the scintillator plate 209 at locations of incidence 213. Also if the electron beamlets 9 are focused onto the surface of the scintillator plate 209, beam spots are formed on the surface, the diameter of which cannot be arbitrarily small. The centers of the beam spots may be considered as the locations of incidence 213 disposed from each other at the distance P2 (see FIG. 1).

The scintillator plate 209 includes a scintillator material emitting light beams when excited by the incident electrons of the electron beamlets 9. Therefore, at each of the locations of incidence 213 a source of light beams is disposed. In FIG. 4, only a single such light beam 221 is shown emitted from the location of incidence 213 of one of the three depicted electron beamlets 9. The light beam 221 propagates through light optics including a first lens 306, a mirror 291, a second lens 292, a third lens 293 and a beam splitter 294 and is then incident onto a light receiving area 330 of the image acquisition system. The light receiving area 330 is formed by a front side of a bundle of glass fibers 295 into which a major portion of the light beam 221 is coupled and guided to light detectors 296, 297, 298, 299, 331. The light detectors may include, for example, photo multipliers, avalanche-photodiodes, photodiodes or other kinds of suitable light detectors. The light optics are configured so that it optically images the surface of the scintillator plate 209 arranged in the detection plane 209a into a region where the light receiving area 330 is disposed. Due to this optical imaging optical images of the locations of incidence 213 are formed in the light receiving area 330. For each of the locations of incidence 213 a separate light receiving area 330 of the image acquisition system is provided. Each of the further light receiving areas 330 is formed by a front side of a light guide 295 guiding the light coupled into the front side to a separate respective light detector 296, 297, 298, 299, 331. Due to the optical imaging each of the locations of incidence 213 is associated with a light receiving area 330 wherein the light incident onto each of the light receiving areas 330 is detected by a separate one of the light detectors 296, 297, 298, 299, 331. The light detectors 296, 297, 298, 299, 331 output detection signals via electric signal lines. The detection signals represent intensities of the electron beamlets 9.

It should be mentioned that in FIG. 4, for simplification, only five light detectors 296, 297, 298, 299, 331 are shown. In a realistic embodiment the number of light detectors 296, 297, 298, 299, 331 corresponds at least to the number of primary charged particle beamlets and the number of secondary electron beamlets 9. In a preferred embodiment the image acquisition system includes even more light detectors 296, 297, 298, 299, 331 than the number of primary charged particle beams, for example five, ten or twenty light detectors for each secondary electron beamlet. A number of more than one light detector for each primary electron beamlet provides additional flexibility in assigning light detectors to a particular secondary charged particle beam.

A small portion of the light beam 221 transmits the beam splitter 294 and impinges onto the spatially resolving detection system 290 which can be a fast CCD camera.

In the embodiment elucidated herein, the light detectors 296, 297, 298, 299, 331 are disposed at a distance from the light receiving areas onto which the light optics (including the first lens 306, the mirror 291, the second lens 292, the third lens 293 and the beam splitter 294) image the scintillator plate 209 and the received light is guided to the light detectors by glass fibers. However, it is also possible that the light detectors 296, 297, 298, 299, 331 are directly disposed where the light optics generate the image of the scintillator plate 209 and the light sensitive areas are thus formed by the light receiving areas.

The secondary electron beamlets 9 propagate in a vacuum and, accordingly, also the surface of the scintillator plate 209 onto which the electron beamlets impinge is disposed in the vacuum. The light optics 306, 291, 292, 293, 294 may be disposed outside the vacuum wherein, then, a vacuum window is provided in the beam path of the light beam 221, the vacuum window being traversed by the beam 221 and separates the vacuum from the environment.

The electron beams incident onto the scintillator plate 209 may ionize residual gas molecules in the region in front of the scintillator plate resulting in electric charges at the locations of incidence 213 and the charges may, in turn, attract residual gaseous contaminant in the vacuum so that the contaminant is deposited at the locations of incidence 213 on the scintillator plate 209 and result in the deterioration of the properties of the scintillator material so that the intensity of the light beams 221 caused by the incident electron beamlets 9 decreases over time. This problem can be coped with by displacing the locations of incidence 213 in a direction orthogonal to a surface normal of the scintillator plate 209, the direction being oriented orthogonal to a normal of a surface of the scintillator plate 209, i.e. within the detection plane 209a. With this, the electron beamlets 9 are not always incident onto the surface of the scintillator plate at the same locations of incidence 213 but are moved over the surface of the scintillator plate 209 and, therefore, moved to ever new locations on its surface. A contamination occurring at distinct locations on the surface of the scintillator plate 209 then does not hinder the generating of light at the locations of incidence 213 caused by the incident electron beamlets 9.

The dynamic electron optical elements are used for dynamically correcting residual imaging errors of secondary electrons (SE) 3 from sample 7 onto the detection plane 209a that are not accounted for by the static imaging system. These residual imaging errors can occur during the scanning of charging surfaces where the imaging properties and constraints, such as starting energy of the SE's or starting angle distribution of the SE's can change within one frame of imaging. These dynamic elements can include one or more electron optical lenses 260, deflectors 280, and stigmators 288. As fast alignment times are typically used in the dynamic case, only electrostatic lenses, electrostatic deflectors, and/or electrostatic stigmators are preferably used. A dynamic controller 170 controls the dynamic electron optical elements 260, 280, and 288, as well as the dynamic sample potential added to the static potential via voltage supply 151. To this end, the dynamic controller 170 uses the spatially resolving detection system 290 that uses a fraction of the signal impinging onto the detection plane 209a. The beam splitting device 400 consists of magnetic sectors that are statically aligned. A fast electrostatic deflection element 410 within the beam splitting device 400 is controlled as well by dynamic controller 170.

A further controller 160 controls the static or low frequency properties and components.

A final lens 263 for producing the spots on the detection plane 209a can be either of the static or dynamic type and controlled by controller 160 or 170, respectively.

Figure 5C:
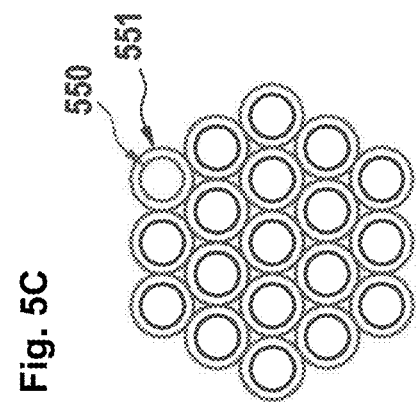
FIG. 5A to FIG. 5F: An illustration of corrections achieved with the dynamic subcomponent of the projective systems in cases of particular distortions caused by sample charging.
Figure 5F:
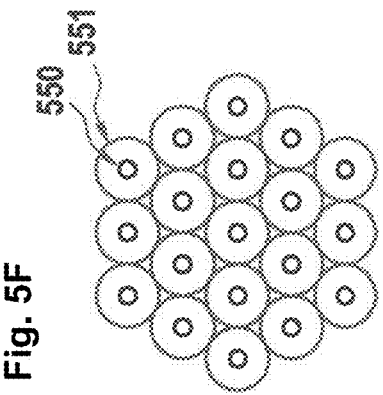
Figure 5B:
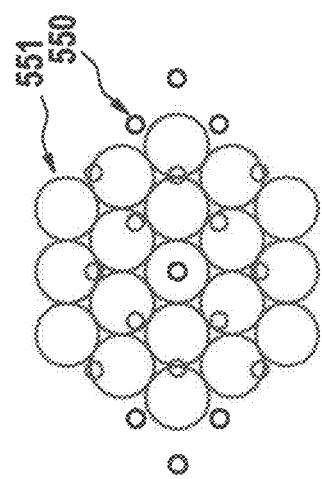
Figure 5E:
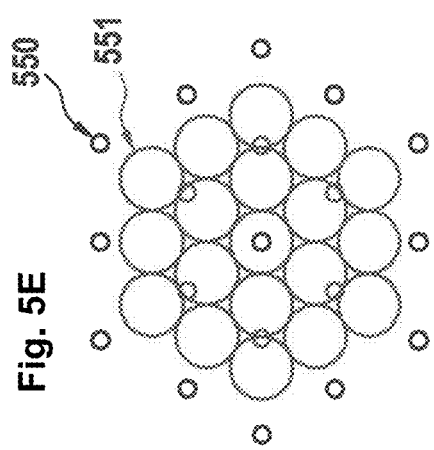
Figure 5A:
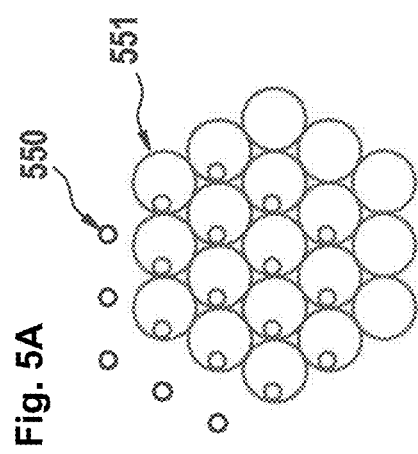

In FIGS. 5A to 5F circles 551 depict the areas on the spatially resolved detection system 290 that correspond to the sensitive areas of the corresponding detectors of the image acquisition system and, accordingly, to the ideal positions of the secondary electron beamlets in the detection plane 209. The mapping between these areas on spatially resolved detection system 290 and the sensitive areas of the image acquisition detectors is fix and can be calibrated upfront (for reference, see U.S. Pat. No. 9,336,982 B2 and references therein, which are hereby incorporated by reference). Circles 550 depict the position distribution of the secondary electron beamlets imaged by projection system 200 onto the detection plane 209a. FIG. 5A depicts a shift between the position distribution of the secondary electron beamlets 550 and the sensitive areas 551. Using fast deflection systems 280, this can be corrected to yield the correct positioning of the secondary electron beamlets 550 onto the sensitive areas 551 shown in FIG. 5F. To achieve this, the shift between the position distribution of the secondary electron beamlets 550 and the sensitive areas 551 is determined by recording and analyzing an image recorded by the spatially resolved detection system 290. Appropriate deflection potentials for the fast deflection system 280 are determined by the real-time projective alignment algorithms 805 by analyzing the recorded image, and the thus determined deflection potentials are applied to the fast deflection system 280 by dynamic controller 170. The deflection potentials are determined in a manner that with the appropriate potentials applied to the fast deflection system 280 the positions of the secondary electrons 550 coincide with the centers of the sensitive areas 551 as shown in FIG. 5F.

FIG. 5B depicts a distortion of the position distribution of the secondary electron beamlets 550 relative to the sensitive areas 551. Using fast stigmation systems 285, this can be corrected to yield the correct positioning of the secondary electron beamlets 550 onto the sensitive areas 551 shown in FIG. 5F. To achieve this, the distortion of the position distribution of the secondary electron beamlets 550 is determined by recording an image by the spatially resolved detection system 290, analyzing the image recorded by the spatially resolved detection system 290 by real-time projective alignment algorithms 805 and determining, based on the image analysis, appropriate stigmator voltages for the fast stigmation system 285. The stigmator voltages are determined by the real-time projective alignment algorithms 805 in a manner that with the appropriate voltages applied to the fast stigmation system 285 the positions of the secondary electron beamlets 550 coincide with the centers of the sensitive areas 551 as shown in FIG. 5F. The respectively determined stigmator voltages are applied to the fast stigmation system 285 by dynamic controller 170.

FIG. 5C depicts a defocus of the secondary electron beamlets 550 with respect to the sensitive areas 551. Using fast lens systems 260, this can be corrected to yield the correct positioning of the secondary electron beamlets 550 onto the sensitive areas 551 shown in FIG. 5F. To achieve this, the defocus of the secondary electron beamlets 550 at the sensitive areas 551 is determined by recording and analyzing, by real-time projective alignment algorithms 805, an image recorded by the spatially resolved detection system 290. Appropriate voltages for the fast lens systems 260 are determined by the real-time projective alignment algorithms 805 and applied to the fast lens systems 260 by dynamic controller 170 in a manner that with the appropriate voltages applied to the fast lens systems 260 the positions of the secondary electron beamlets 550 coincide with the centers of the sensitive areas 551 and the diameters of the light spots on the spatially resolved detection system 290 are minimized or have the appropriate dimensions as shown in FIG. 5F.

Figure 5D:
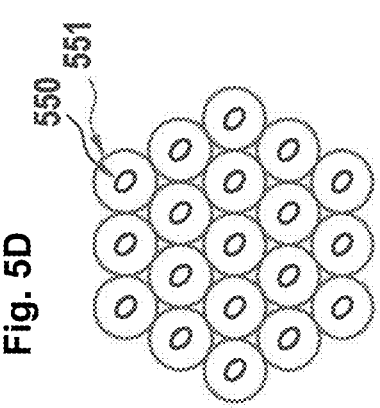

FIG. 5D depicts an astigmatic imaging of the secondary electron beamlets 550 onto the sensitive areas 551. Using fast stigmation systems 285, this can be corrected to yield the correct positioning of the secondary electron beamlets 550 onto the sensitive areas 551 shown in FIG. 5F. Keeping the spot positions correct at the same time involves the use of at least two stigmators, as described in great detail in US 20150357157 A1 which is hereby incorporated by reference. To achieve stigmation, the distortion of the stigmatic imaging of the secondary electron beamlets 550 is determined by recording and analyzing an image recorded by the spatially resolved detection system 290. Appropriate stigmator voltages for the fast stigmation system 285 are determined by the real-time projective alignment algorithms 805 and such stigmator voltages are applied to the fast stigmation system 285 by dynamic controller 170. The stigmator voltages are determined, based on the image analysis, in a manner that with the appropriate voltages applied to the fast stigmation system 285 the form of the beam spots of the secondary electron beamlets 550 become circular with their centers in the centers of the sensitive areas 551 as shown in FIG. 5F.

FIG. 5E depicts a magnification change in the imaging of the secondary electron beamlets 550 with respect to the sensitive areas 551. Using fast lens systems 260, this can be corrected to yield the correct positioning of the secondary electron beamlets 550 onto the sensitive areas 551 shown in FIG. 5F. Keeping the spot positions correct at the same time involves the use of at least two lenses, as described in great detail in US 20150357157 A1 which is hereby incorporated by reference. To achieve this, the magnification change of the secondary electron beamlets 550 at the sensitive areas 551 is determined by recording and analyzing an image recorded by the spatially resolved detection system 290. Appropriate voltages for the fast lens systems 260 are determined by the real-time projective alignment algorithms 805, based on the image analysis, and applied to the fast lens systems 260 by dynamic controller 170. The appropriate voltages are determined by the real-time projective alignment algorithms 805 in a manner that with the appropriate voltages applied to the fast lens systems 260 the positions of all the secondary electron beamlets 550 coincide with the centers of the sensitive areas 551 and the diameters of the light spots on the spatially resolved detection system 290 are minimized or have the appropriate dimensions as shown in FIG. 5F.

Above, with respect to FIG. 5A to 5F only the correction of individual distortions is described. However, the real-time projective alignment algorithms 805 advantageously are configured also to determine appropriate potentials and voltages for the fast alignment components if the images recorded with the spatially resolved detection system 290 show combinations of the described distortions. Appropriate voltages for the electrostatic lenses, the electrostatic stigmators and the electrostatic deflectors then are determined by the real-time projective alignment algorithms 805 concurrently or sequentially in iterative steps.

The recording of the images with the spatially resolved detection system 290 takes place before an image of the sample is recorded by the aid of the multi detector or while portions of the image of the sample are recorded by the aid of the multi detector, for example after a predetermined number of lines has been scanned by the plurality of primary electron beamlets.

Figure 9A:
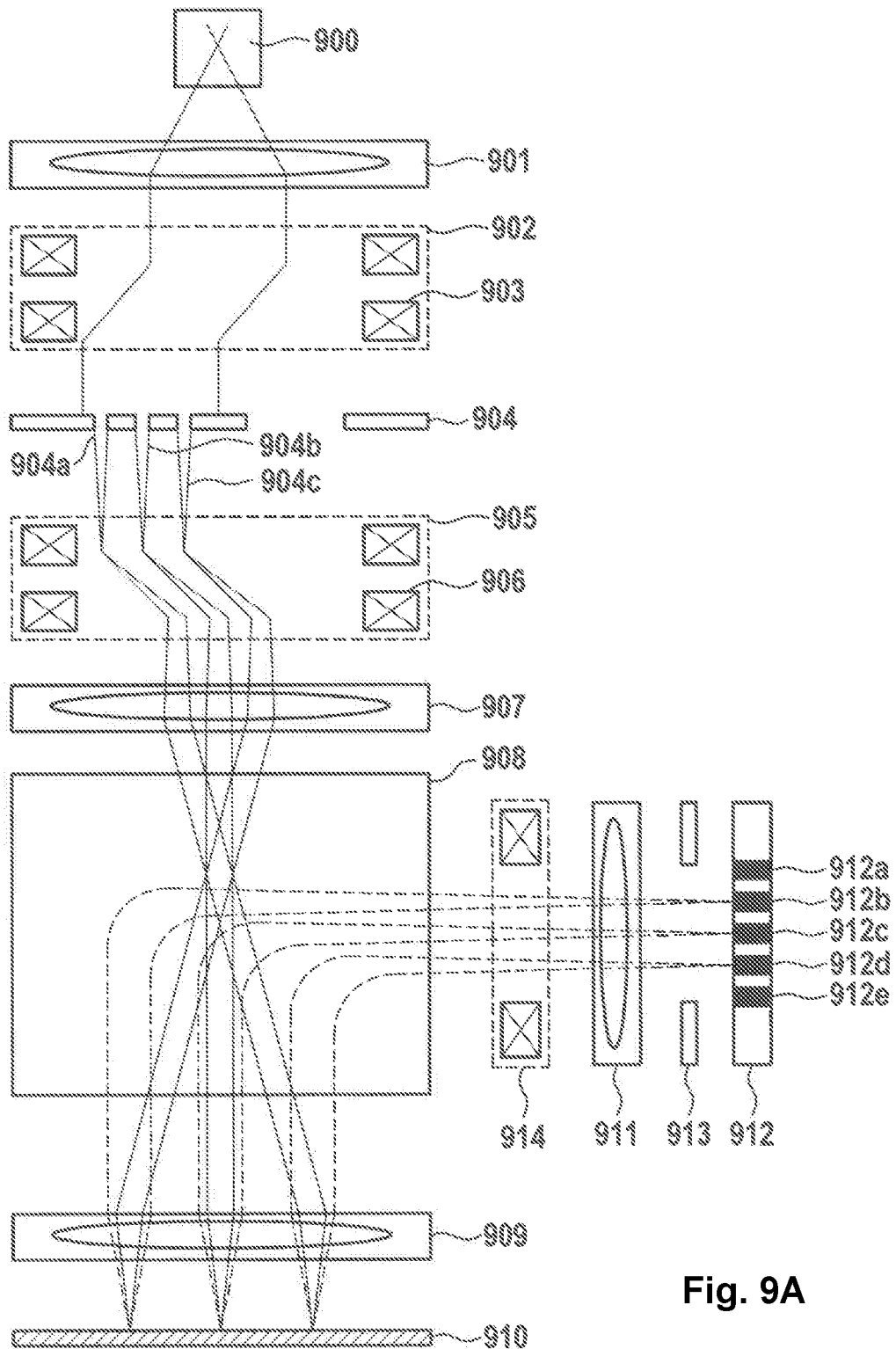
FIG. 9A: A sketch of the beam path in a multi beam charged particle beam system in a first mode of operation.

The charged particle beam system in FIG. 9A has a similar design as the system shown in FIG. 1. In FIG. 9A the charged particle source is depicted with the reference numeral 900. In the beam path of the charged particles emitted by the charged particle source 900 at least one collimating lens 901 is arranged. Following in the direction of emission of charged particles downstream of the collimating lens, a multi aperture plate 904 having a plurality of holes is arranged for generating a plurality of charged particle beamlets 904a to 904c from the charged particle beam emitted by the charged particle source 900. Between the collimating lens 901 and the multi aperture plate a first deflection system 902 is arranged. The first deflection system 902 can either be a single deflection system or a double deflection system having two deflectors 902, 903.

Between the multi aperture array 904 and the field lens 907 a further, second deflection system 905 is arranged. Also this second deflection system can be either a single deflection system or a double deflection system having two deflectors 905, 906. The first deflection system 902 and the second deflection system 905 serve to switch between the first mode of operation, i.e. recording of images of a sample by concurrently scanning the sample by a multitude of charged particle beamlets and detecting interaction products leaving the sample due to the impinging primary charged particle beamlets, and the second mode of operation in which the sample is flooded with an defocused charged particle beam to compensate for sample charging.

As described already in combination with FIG. 1, following downstream in the direction of propagation of the primary charged particles a beam splitter 908 and an objective lens 909 are arranged. By the objective lens 909 the primary charged particle beamlets are focused on a sample 910 to be arranged in a sample plane (first plane).

In the secondary beam path, i.e. in the beam path of interaction products leaving the sample 910 due to the impinging primary charged particles between the projective system 911 and the multi detector 912 with the separate detecting regions 912*a* to 912*e* a projective stop 913 is arranged. Also, between the objective lens 909 and the beam splitter 908 or following downstream of the beam splitter a further deflector 914 is arranged.

Figure 9B:
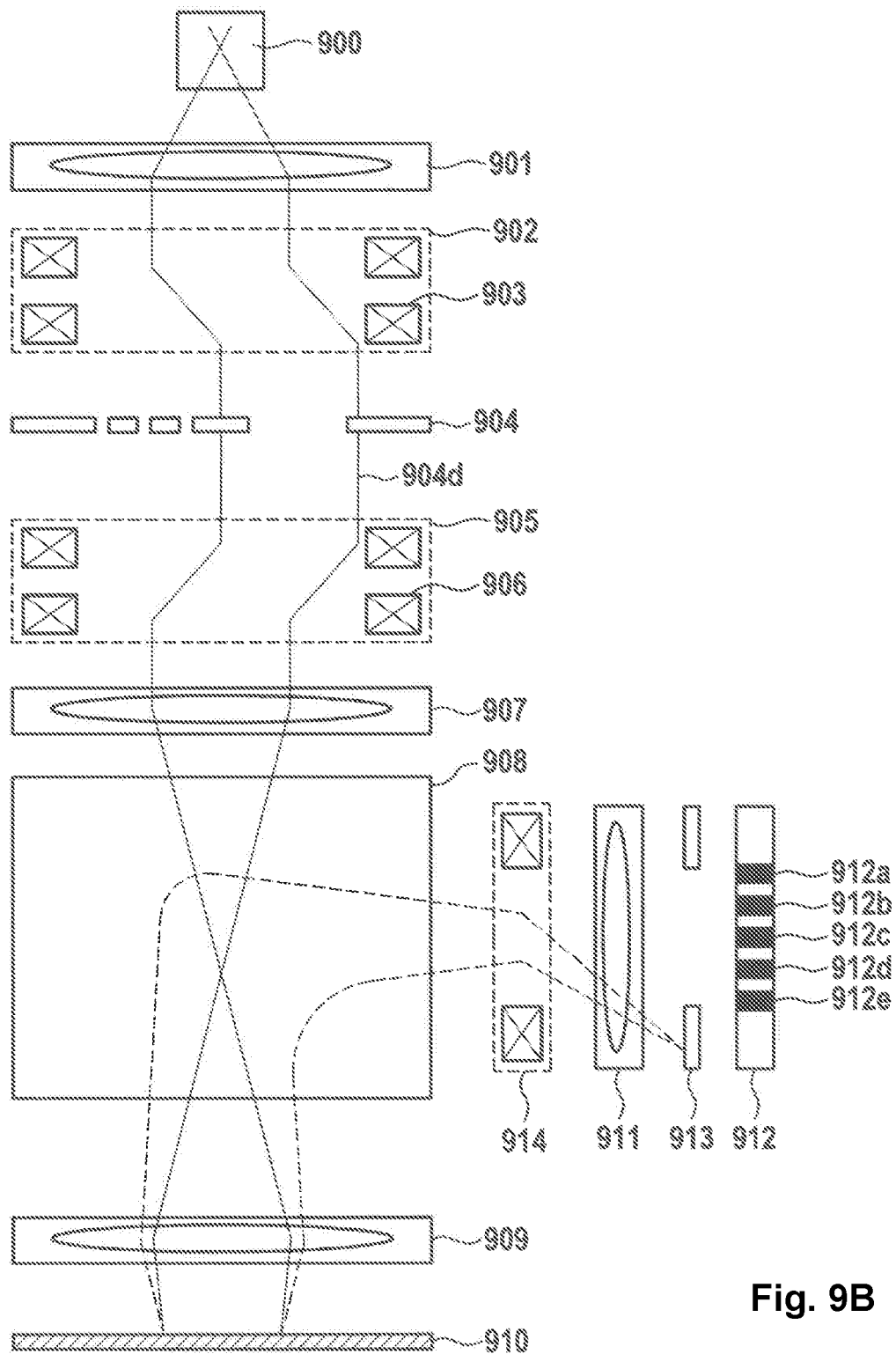
FIG. 9B: A sketch of the beam path in the multi beam charged particle beam system of FIG. 9A in a second mode of operation.
Figure 10:
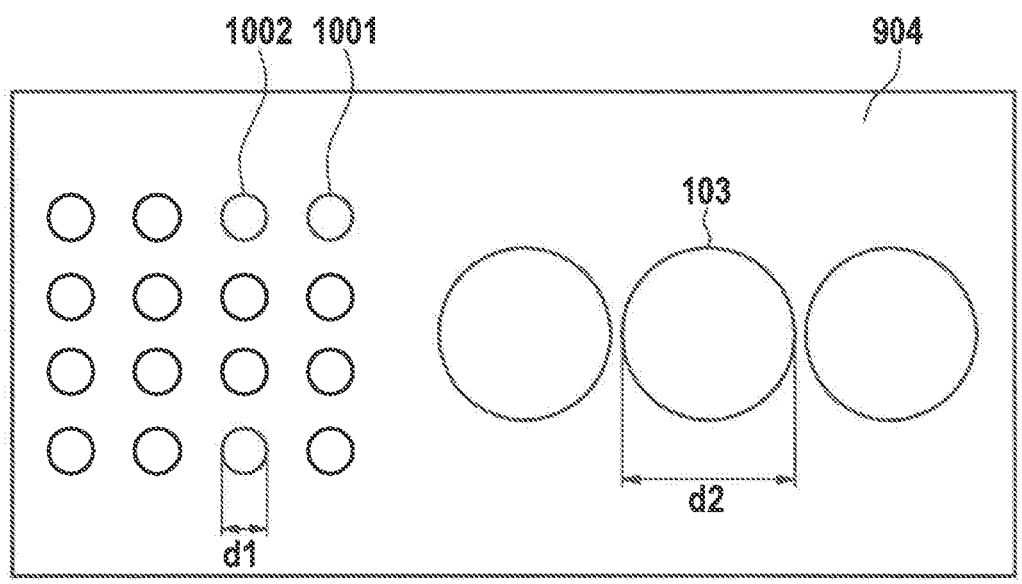
FIG. 10: A top view onto a multi aperture plate in the embodiment of FIG. 9A.

In the first mode of operation, the control of the multi beam charged particle beam system controls the first and second deflection system 902 and/or 903, 905 and/or 906 so that a plurality of charged particle beamlets impinge on the sample. To achieve this, the first deflection system 902/903 directs the incoming charged particle beam to impinge onto the plurality of holes 1001, 1002 (see FIG. 10) of the multi aperture plate 904 having a diameter d1. In the second mode of operation the control of the multi beam charged particle beam system controls the first and second deflection system 902/903, 905/906 so that the incoming charged particle beam is directed onto the larger holes 103 (see FIG. 10) of the multi aperture plate 904 having a diameter d2. As described above, d2 is at least 5 times d1. In the second mode of operation concurrently with deflecting the primary beam to impinge onto the plurality of holes 1001, 1002 the control controls the projective system 911, e.g. via deflector 914, to direct all, or at least the majority of interaction products caused to leave the sample 910 due to the impinging primary charged particles to impinge onto the projective stop 913 (see FIG. 9B). In both modes of operation, the beams pass through the objective lens 909 onto the sample 910.

Figure 11A:
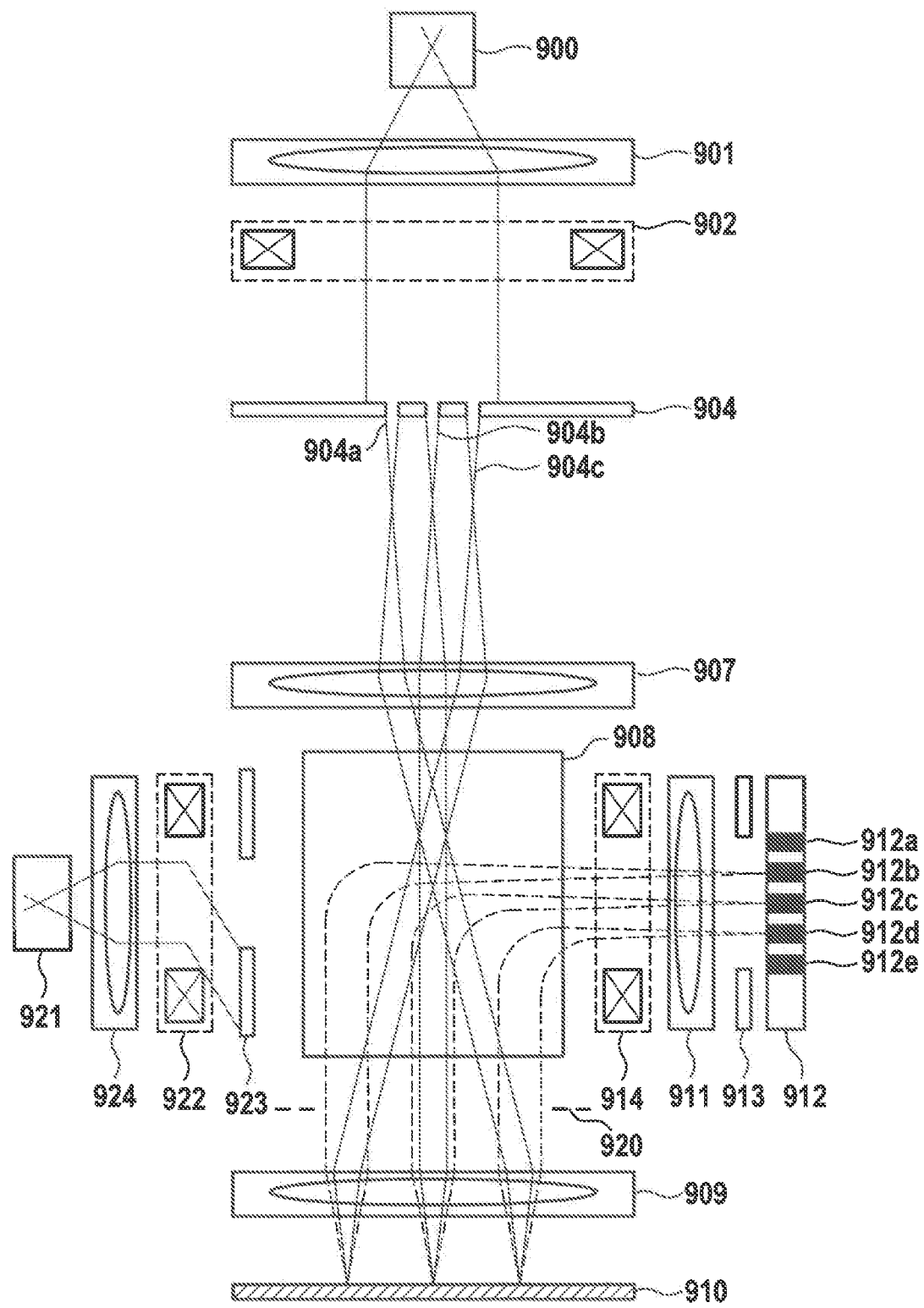
FIG. 11A: A sketch of a multi beam charged particle beam system having a second charged particle beam source for flooding in the first mode of operation.
Figure 11B:
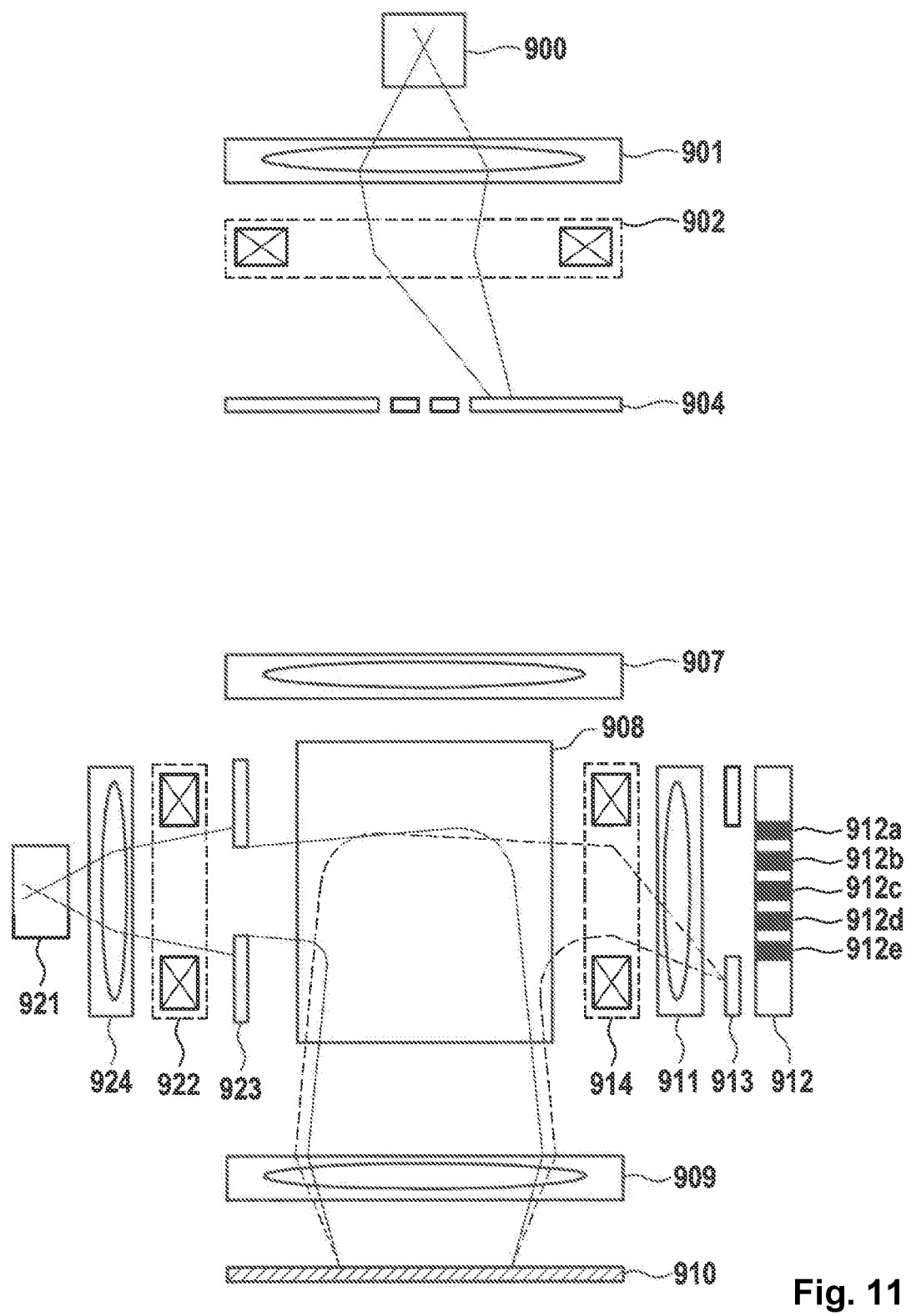
FIG. 11B: A sketch of the multi beam charged particle beam system in FIG. 11A in the second mode of operation.

The embodiment in FIGS. 11A and 11B is similar to the embodiment shown in FIG. 9A. Components identical to components in FIG. 9A are depicted with identical reference numerals and regarding their design and functions reference is made to the above description of FIGS. 9A and 9B. The embodiment in FIG. 11 has a second charged particle source 921 serving only for flooding the sample. Following downstream of the second charged particle source 921 a deflection system 922 and a beam stop 923 are arranged. In addition, a second beam stop 920 can be provided between the beam splitter 908 and the objective lens 909.

In the first mode of operation the control of the charged particle beam system controls the deflector 922 in the beam path of the second charged particle beam emitted by the second charged particle source 921 to impinge onto the beam stop 923. Concurrently, the control controls the multi beam generator to generate a plurality of primary charged particle beamlets to impinge onto the sample 910. In this mode of operation the sample 910 is scanned by the plurality of charged particle beamlets and interaction products caused to leave the sample due to the primary beamlets are detected by multi detector 912. In the second mode of operation the control controls the multi beam generator, for example by a different excitation of the deflection system 902 (and/or the deflections system 903, and/or the deflections system 905/906 in FIG. 9A) to direct the charged particle beamlets onto the stop 920 arranged between the beam splitter 908 and the objective lens. The beam stop 920 can also be placed between the multi aperture plate 904 and the beam splitter 908, or deflection system 902/903 can be used to deflect the primary beam illuminating the multiple holes of the first multi aperture plate in the first mode to an area without holes as shown in FIG. 11B. Concurrently, the control controls the deflector 922, and/or the objective lens 909 and/or the sample position so that the charged particles emitted by the second charged particle source 921 pass through the opening in the beam stop 923 and impinge onto the sample 910 in a defocused manner. Then, the charged particles emitted by the second charged particle source impinge onto a large area on a surface of the sample 910 in a defocused manner. Again, in both the first and the second mode of operation, the charged particle beams traverse through the objective lens hole.

Figure 12A:
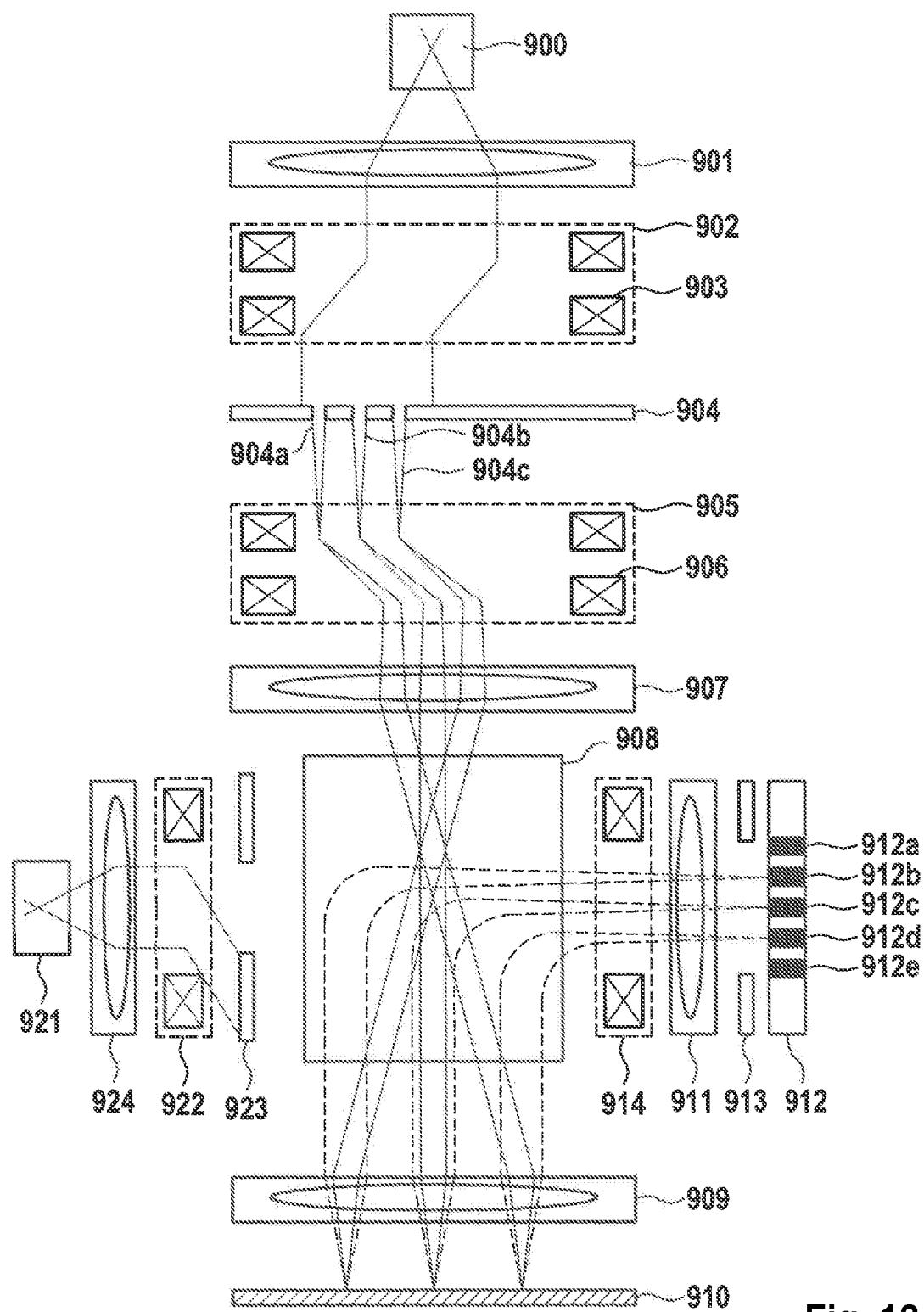
FIG. 12A: A sketch of a further embodiment of a multi beam charged particle beam system having a second charged particle beam source for flooding in the first mode of operation.
Figure 12B:
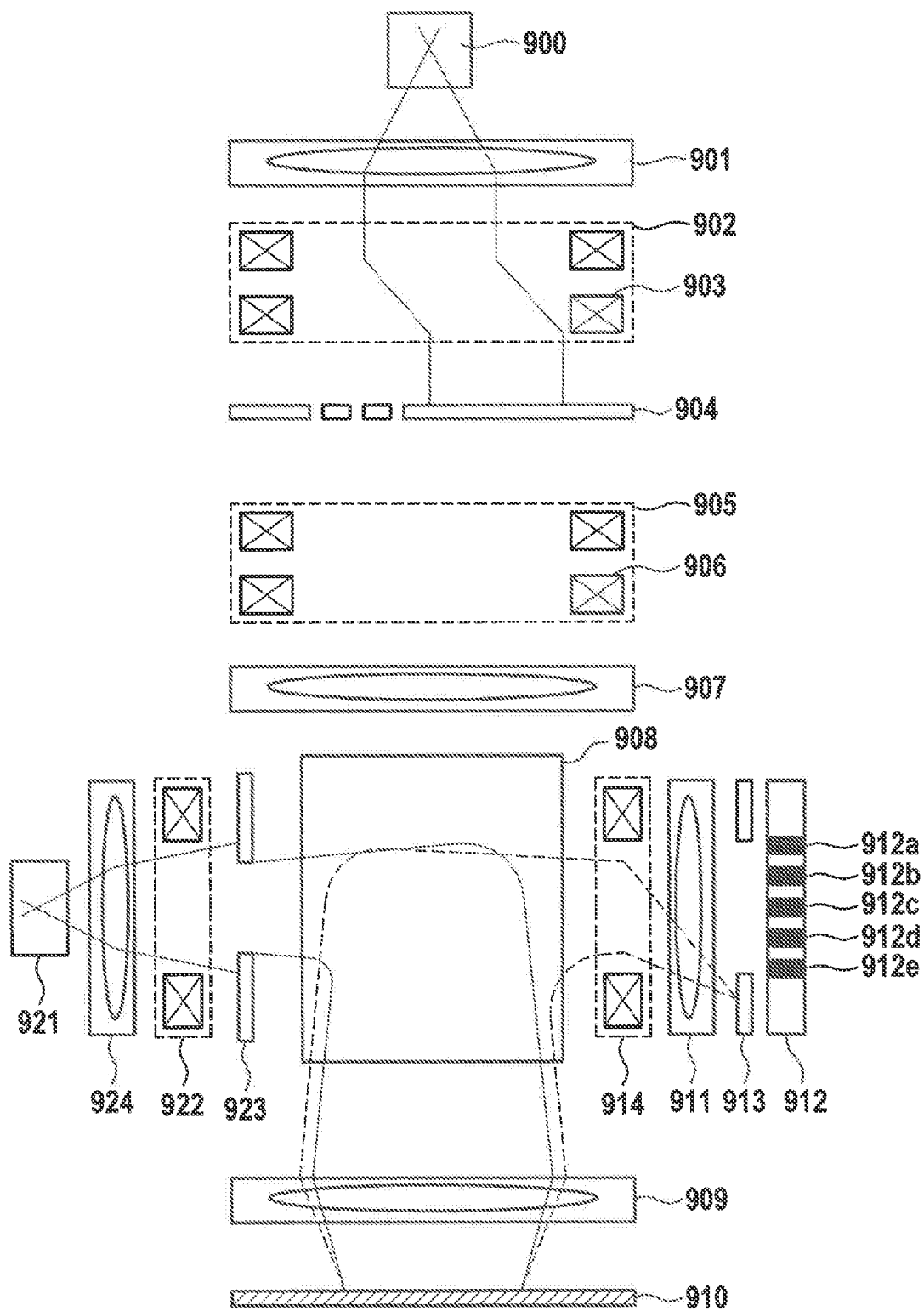
FIG. 12B: A sketch of the multi beam charged particle beam system in FIG. 12A in the second mode of operation.

FIGS. 12A and 12B show a second embodiment of a charged particle beam system with the second charged particle source 921. Identical components in FIGS. 11A and 11B as well as 12A and 12B are assigned identical reference numerals. In the embodiments shown in FIGS. 12A and 12B the first multi aperture plate 904 itself serves as a beam stop for the charged particles emitted by charged particle source 900. In the first mode of operation the deflections systems 902, 903 upstream of the multi aperture plate 904 are excited to deflect the charged particle beam emitted by charged particle source 900 to a region with the plurality of hole in the multi aperture plate 904 to generate the multiple charged particle beamlets 904*a* to 904*c*. The deflection system 905, 906 downstream of the multi aperture plate is excited to re-align the charged particle beamlets with an optical axis of the objective lens 909. Concurrently the deflection system 922 in the beam path emitted by the second charged particle beam source 921 is excited to deflect the charged particle beam emitted by the second charged particle beam source 922 to impinge onto the beam stop 923.

In the second mode of operation illustrated in FIG. 12B the deflection system 902, 903 arranged upstream of the multi aperture plate 904 is excited to deflect the charged particle beam emitted by charged particle source 900 to impinge onto a region of the multi aperture plate 904 without any hole. Concurrently the deflection system 922 in the beam path emitted by the second charged particle beam source 921 is excited to deflect the charged particle beam emitted by the second charged particle beam source 922 to pass through a hole in the beam stop 923. Concurrently the deflection system 914 in the projective beam path is excited to deflect all or the majority of interactions products leaving the sample 910 due to the impinging charged particles to impinge onto the beam stop 913 in the secondary beam path.

In an embodiment the above described methods for charge compensation by flooding the sample with a defocused charged particle beam and for controlling a dynamic subcomponent of the projective system to eliminate beam disturbances due to charging of the sample are combined.

What is claimed is:

1. A charged particle beam system, comprising:
a first charged particle source configured to generate a first charged particle beam;
a multi beam generator configured to generate a plurality of charged particle beamlets from the first charged particle beam, the plurality of charged particle beamlets comprising a first individual charged particle beamlet and a second individual charged particle beamlet, the multi beam generator comprising a first multi aperture plate comprising a plurality of holes configured to form the plurality of charged particle beamlets, the holes comprising a first hole having a first hole diameter and a second hole having a second hole diameter, the second hole diameter being bigger than the first hole diameter;
an objective lens;
a projective system;
a sample stage;
a detector system comprising a plurality of individual detectors, the plurality of individual detectors comprising a first individual detector and second individual detector;
a control configured to control the operation of the multi beam generator, the objective lens and the projective system;
a beam splitter arrangement upstream of the objective lens;
a first single or double deflection system arranged between the charged particle source and the first multi aperture plate; and
a second single or double deflection system arranged between the first multi aperture plate and the objective lens,
wherein:
the control has a first mode of operation and a second mode of operation which is different from the first mode of operation;
in the first mode of operation of the control, the control is configured to control:
 i) the multi beam generator so that each individual charged particle beamlet of the plurality of charged particle beamlets is spatially separated from other charged particle beamlets of the plurality of charged particle beamlets;
 ii) the objective lens to focus incoming charged particle beamlets in a first plane so that a first region in which the first individual charged particle beamlet impinges in the first plane is spatially separated from a second region in which the second individual charged particle beamlet impinges in the first plane;
 iii) the projective system to image interaction products leaving the first region within the first plane due to impinging charged particles onto the first individual detector and to image interaction products leaving the second region in the first plane due to impinging charged particles onto the second individual detector;
 iv) the first single or double deflection system and the second single or double deflection systems so that the charged particle beam passes through the first hole; and
 v) the beam splitter to separate a primary beam path of the charged particle beamlets from a secondary beam path the interaction products; and in the second mode of operation of the control, the control is configured to control:
 i) operation of the multi beam generator in combination with the objective lens to provide a defocused charged particle beam in the first plane; and
 ii) the first single or double deflection system and the second single or double deflection systems so that the charged particle beam passes through the second hole.

2. The charged particle beam system of claim 1, wherein:
the objective lens comprises an opening; and
the charged particle beam system is configured so that:
 in the first mode of operation of the control, the primary charged particle beamlets pass though the opening of the objective lens; and
 in the second mode of operation of the control, the charged particle beam passes though the opening in the objective lens.

3. The charged particle beam system of claim 1, further comprising a voltage supply configured to supply a variable voltage to the sample stage, wherein:
in the first mode of operation of the control, the control is configured to control the objective lens and/or the voltage supply so that the charged particles of the charged particle beamlets have a first average kinetic energy in the first plane; and
in the second mode of operation of the control, the control is configured to control the objective lens and/or the voltage supply so that the charged particles have a second average kinetic energy in the first plane, the second average energy being different from the first average kinetic energy.

4. The charged particle beam system of claim 3, wherein the first average kinetic energy is greater than 400 eV, and the second average kinetic energy is less than 1000 eV.

5. The charged particle beam system of claim 1, wherein:
in the second mode of operation of the control, the defocused charged particle beam has a second diameter in the first plane;
in the first mode of operation of the controller, a minimum diameter of a circle surrounding an area onto which the plurality of charged particle beamlets impinge in the first plane has a first diameter; and
the second diameter is at least 1.2 times the first diameter.

6. The charged particle beam system of claim 1, wherein:
in the first mode of operation of the control, a minimum surface area within which all beamlets of the plurality of charged particle beamlets impinge in the first plane has a first area;
in the second mode of operation of the control, the defocused charged particle beam illuminates a surface in the first plane having a second surface area; and
the second surface area is at least 1.5 times the first surface area.

7. The charged particle beam system of claim 1, wherein the second hole diameter is at least 5 times the first hole diameter.

8. The charged particle beam system of claim 7, wherein the first multi aperture plate is displaceable in a direction perpendicular to a direction of propagation of the first charged particle beam.

9. A charged particle beam system, comprising:
a first charged particle source configured to generate a first charged particle beam;
a multi beam generator configured to generate a plurality of charged particle beamlets from the first charged particle beam, the plurality of charged particle beamlets comprising a first individual charged particle beamlet and a second individual charged particle beamlet;
an objective lens;
a projective system;
a sample stage;
a detector system comprising a plurality of individual detectors, the plurality of individual detectors comprising a first individual detector and second individual detector;
a control configured to control the operation of the multi beam generator, the objective lens and the projective system;
a beam splitter arrangement upstream of the objective lens;
a second charged particle source configured to provide a second charged particle beam;
a deflection system; and
a beam stop,
wherein:
  the control has a first mode of operation and a second mode of operation which is different from the first mode of operation;
  in the first mode of operation of the control, the control is configured to control:
    i) the multi beam generator so that each individual charged particle beamlet of the plurality of charged particle beamlets is spatially separated from other charged particle beamlets of the plurality of charged particle beamlets;
    ii) the objective lens to focus incoming charged particle beamlets in a first plane so that a first region in which the first individual charged particle beamlet impinges in the first plane is spatially separated from a second region in which the second individual charged particle beamlet impinges in the first plane;
    iii) the projective system to image interaction products leaving the first region within the first plane due to impinging charged particles onto the first individual detector and to image interaction products leaving the second region in the first plane due to impinging charged particles onto the second individual detector; and
    iv) the beam splitter to separate a primary beam path of the charged particle beamlets from a secondary beam path the interaction products; and
  in the second mode of operation of the control, the control is configured to control operation of the deflection system in combination with the objective lens to provide a defocused charged particle beam in the first plane;
  in the first mode of operation of the control, the control is configured to control the deflection system to direct the second charged particle beam onto the beam stop; and
  in the second mode of operation of the control, the control is configured to direct the second charged particle beam to pass the beam stop.

10. The charged particle beam system of claim 9, further comprising a flooding beam stop and a deflection system, wherein:
  in the first mode of operation of the control, the control is configured to control the deflection system to direct the charged particle beamlets to pass the flooding beam stop; and
  in the second mode of operation of the control, the control is configured to direct the charged particle beamlets to the flooding beam stop.

11. The charged particle beam system of claim 1, wherein:
  the projective system comprises a first subcomponent and a second subcomponent;
  the control is configured to control the first subcomponent to provide low frequency adjustments to the projective system; and
  the control is configured to control the second subcomponent to provide high frequency adjustments to the projective system.

12. The charged particle beam system of claim 11, wherein the second subcomponent comprises at least one member selected from the group consisting of electrostatic lenses, electrostatic deflectors and electrostatic stigmators.

13. The charged particle beam system of claim 10, wherein the projective system comprises a current monitoring aperture in a cross-over plane.

14. The charged particle beam system of claim 1, further comprising a fast CCD camera.

15. The charged particle beam system of claim 11, wherein the control is configured to analyze an actual state of the projective system and to manipulate the second subcomponent during scanning of a sample by the plurality of charged particle beamlets.

16. The charged particle beam system of claim 15, wherein the control is configured to adjust the second subcomponent so that positions of the interaction products on the individual detectors are kept constant.

17. The charged particle beam system of claim 16, wherein the control is configured to adjust the projective system in a two-step mode so that:
  in a first step, the first component is adjusted while the second subcomponent is kept constant or switched-off; and
  in a second step, the second subcomponent is adjusted while the first subcomponent is kept constant.

18. The charged particle beam system of claim 17, further comprising:
  a projective beam stop between the first plane and the detector system; and
  a deflection system between the first plane and the detector system, wherein:
    in the first mode of operation of the control, the control is configured to control the deflection system to direct emission products from the charged particle beamlets to impinge onto the detector system;
    in the second mode of operation of the control, the control is configured to direct the emission products of the second charged particle beamlets to the beam stop.

19. A method, comprising:
  providing the charged particle beam system of claim 1;
  in the first mode, forming the plurality of charged particle beamlets of the multi beam charged particle beam system, scanning a sample with the charged particle beamlets, and detecting interaction products leaving the sample due to the impinging plurality of charged particles beamlets;
  in the second mode, flooding the sample with the defocused charged particle beam;
  switching between the first and second modes several times while recording an image of the sample; and
  when switching between the first and second modes, changing at least one of parameter selected from the group consisting of landing energy, focus, stage position, and beam deflection of the charged particle beam system.

20. The method of claim 19, wherein, in the first and second modes, the charged particle beams pass through an identical aperture in an objective lens of the charged particle beam system.

21. The method of claim 19, wherein:
in the second mode, the defocused charged particle beam has a second diameter in the first plane;
in the first mode, a minimum diameter of a circle surrounding an area onto which the plurality of charged particle beamlets impinge in the first plane has a first diameter; and
the second diameter is at least 1.2 times the first diameter.

22. The method of claim 19, wherein:
in the second mode, the defocused charged particle beam illuminates a surface in the in the first plane having a second surface area;
in the first mode, a minimum surface area within which all beamlets of the plurality of charged particle beamlets impinge in the first plane has a first area; and
the second surface area is at least 1.5 times the first surface area.

23. The method of claim 19, further comprising:
in the first mode, directing emission products form the charged particle beamlets to impinge onto a detector system; and
in the second mode, directing emission products from an sample to a projective beam stop.

24. The method of claim 19, further comprising:
aligning the multi beam charged particle beam system with static methods and static charged particle optical elements, with a fast multi beam projective alignment method in an off state; and
activating a fast multi beam projective alignment system before a first image is recorded by controlling a state of a charged particle projective system for optimal imaging of interaction products onto a plurality of detectors and controlling the fast multi beam projective alignment system.

25. The charged particle beam system of claim 9, wherein:
the projective system comprises a first subcomponent and a second subcomponent;
the control is configured to control the first subcomponent to provide low frequency adjustments to the projective system; and
the control is configured to control the second subcomponent to provide high frequency adjustments to the projective system.

26. The charged particle beam system of claim 25, wherein the second subcomponent comprises at least one member selected from the group consisting of electrostatic lenses, electrostatic deflectors and electrostatic stigmators.

27. A method, comprising:
providing the charged particle beam system of claim 9;
in the first mode, forming the plurality of charged particle beamlets of the multi beam charged particle beam system, scanning a sample with the charged particle beamlets, and detecting interaction products leaving the sample due to the impinging plurality of charged particles beamlets;
in the second mode, flooding the sample with the defocused charged particle beam;
switching between the first and second modes several times while recording an image of the sample; and
when switching between the first and second modes, changing at least one of parameter selected from the group consisting of landing energy, focus, stage position, and beam deflection of the charged particle beam system.

* * * * *

UNITED STATES PATENT AND TRADEMARK OFFICE
CERTIFICATE OF CORRECTION

PATENT NO. : 11,239,053 B2
APPLICATION NO. : 17/002472
DATED : February 1, 2022
INVENTOR(S) : Dirk Zeidler It is certified that error appears in the above-identified patent and that said Letters Patent is hereby corrected as shown below:

In the Specification

Columns 3, Lines 66-67 and Columns 4, Lines 1-5, delete "Switching between the first mode of operation in which the sample is scanned simultaneously by a plurality of charged particle beamlets, and flooding of the sample by an electron beam then is achieved by displacing the first multi aperture plate relative to the first charged particle beam so that the first charged particle beam impinges on one or more of the second holes." and insert the same on Column 3, Line 65 as a continuation of the same paragraph;

Column 5, Line 58, delete "the in the" and insert -- the --;

In the Claims

Column 20, Line 14, Claim 2, delete "though" and insert -- through --;

Column 20, Line 17, Claim 2, delete "though" and insert -- through --;

Column 23, Line 18, Claim 22, delete "the in the" and insert -- the --.

Signed and Sealed this
Second Day of August, 2022

Katherine Kelly Vidal
*Director of the United States Patent and Trademark Office*